United States Patent
Unton et al.

(10) Patent No.: US 12,108,571 B2
(45) Date of Patent: Oct. 1, 2024

(54) ELECTRONICS CABINET COOLING SYSTEM

(71) Applicant: Rolls-Royce North American Technologies Inc., Indianapolis, IN (US)

(72) Inventors: Timothy Unton, Indianapolis, IN (US); Eric Donovan, Indianapolis, IN (US)

(73) Assignee: Rolls-Royce North American Technologies Inc., Indianapolis, IN (US)

( * ) Notice: Subject to any disclaimer, the term of this patent is extended or adjusted under 35 U.S.C. 154(b) by 410 days.

(21) Appl. No.: 17/454,984

(22) Filed: Nov. 15, 2021

(65) Prior Publication Data

US 2022/0361371 A1    Nov. 10, 2022

Related U.S. Application Data

(63) Continuation-in-part of application No. 17/313,392, filed on May 6, 2021.

(51) Int. Cl.
*H05K 7/20* (2006.01)

(52) U.S. Cl.
CPC ..... *H05K 7/20354* (2013.01); *H05K 7/20318* (2013.01); *H05K 7/20327* (2013.01); *H05K 7/20736* (2013.01); *H05K 7/20818* (2013.01)

(58) Field of Classification Search
CPC ...... F25B 25/005; F25B 41/22; F25B 43/006; F25B 49/027; F25B 2400/16;
(Continued)

(56) References Cited

U.S. PATENT DOCUMENTS

| 5,187,950 A | 2/1993 | Weldon |
| 5,467,250 A | 11/1995 | Howard et al. |

(Continued)

FOREIGN PATENT DOCUMENTS

| EP | 2 873 934 A1 | 5/2015 |
| EP | 2 933 583 A1 | 10/2015 |
| WO | WO 2017/014504 A1 | 1/2017 |

OTHER PUBLICATIONS

"A better environment with next-generation solstice zd refrigerant," dated May 2019, pp. 1-8, Honeywell International Inc., Gaston Geenslaan 14 3001 Heverlee Belgium, available at www.honeywell-refrigerants.com/europe.

(Continued)

*Primary Examiner* — Jonathan Bradford
(74) *Attorney, Agent, or Firm* — Barnes & Thornburg LLP

(57) ABSTRACT

An electronics cabinet cooling system may include multiple cabinet heat exchangers mounted at an air discharge of respective different electronic cabinets. Heat from a flow of air heated by electronic components in the electronic cabinets may be received by respective cabinet heat exchangers. A liquid refrigerant flowing through the heat exchangers in parallel may be at least partially changed from liquid to gas and absorb the heat from the flow of air. A three-way tee in a common outlet header downstream from the cabinet heat exchangers may direct the gas refrigerant to a condenser and the liquid refrigerant to a receiver. The condenser may condense the gas refrigerant to liquid refrigerant, which may be routed to the receiver.

19 Claims, 6 Drawing Sheets

(58) Field of Classification Search
CPC ...... F25B 2600/2501; F25B 2600/2513; F25B 2600/2523; F25B 2600/2515; F25B 2700/191; H05K 7/20318; H05K 7/20327; H05K 7/20354; H05K 7/20736; H05K 7/20818
See application file for complete search history.

(56) References Cited

U.S. PATENT DOCUMENTS

| | | | |
|---|---|---|---|
| 6,462,944 B1 | 10/2002 | Lin | |
| 7,660,116 B2 | 2/2010 | Claassen et al. | |
| 8,250,877 B2 | 8/2012 | Correa et al. | |
| 8,322,154 B2 | 12/2012 | Campbell et al. | |
| 8,424,326 B2 | 4/2013 | Mitra et al. | |
| 8,671,703 B2 | 3/2014 | Mitra et al. | |
| 8,671,706 B2 | 3/2014 | Chin et al. | |
| 8,875,527 B2 | 11/2014 | Muir et al. | |
| 8,929,075 B2 | 1/2015 | Eckberg et al. | |
| 9,038,404 B2 * | 5/2015 | Judge | F25B 25/00 62/175 |
| 9,068,766 B2 | 6/2015 | Tamaki et al. | |
| 9,200,820 B2 | 12/2015 | Okazaki et al. | |
| 9,295,182 B2 | 3/2016 | Iyengar et al. | |
| 9,297,571 B1 | 3/2016 | Correa et al. | |
| 9,507,393 B2 | 11/2016 | Alshinnawi et al. | |
| 9,655,282 B2 | 5/2017 | Barringer et al. | |
| 10,088,202 B2 | 10/2018 | Huff et al. | |
| RE47,783 E | 12/2019 | Deschamps | |
| 10,906,150 B2 | 2/2021 | Jansen et al. | |
| 10,912,230 B1 | 2/2021 | Gao | |
| 10,921,042 B2 | 2/2021 | Donovan et al. | |
| 11,022,338 B2 | 6/2021 | Chun et al. | |
| 2007/0051244 A1 | 3/2007 | Chang | |
| 2010/0096105 A1 | 4/2010 | Novotny et al. | |
| 2014/0262163 A1 | 9/2014 | Deschamps | |
| 2016/0278239 A1 | 9/2016 | Chainer et al. | |
| 2016/0305697 A1 | 10/2016 | Kopko et al. | |
| 2017/0045257 A1 | 2/2017 | Moffitt | |
| 2018/0288904 A1 | 10/2018 | Chainer et al. | |
| 2020/0326114 A1 | 10/2020 | Donovan et al. | |
| 2021/0153391 A1 | 5/2021 | Gao | |

OTHER PUBLICATIONS

"What is R 1233zd?" dated 2020, pp. 1-5, Treehozz, available at https://treehozz.com/what-is-r-1233zd.

"Solstice zd (R-1233zd)," dated Sep. 2021, pp. 1-2, Honeywell International Inc., available at https://www.honeywell-refrigerants.com/europe/product/solstice-zd/.

"Storage, Handling and Use Guidelines for Solstice® zd Refrigerant," dated Apr. 2015, Honeywell International Inc., pp. 1-4, Gaston Geenslaan 14 3001 Heverlee Belgium, available at www.honeywell-refrigerants.com/europe.

"5 answers for a better environment Solstice zd refrigerant," dated Oct. 2014, pp. 1-2, Honeywell International Inc., available at www.honeywell-refrigerants.com.

"Advanced refrigerants R1233ZD as substitute of R123," dated Sep. 2021, pp. 1-8, Araner, available at https://www.araner.com/blog/advanced-refrigerants-r1233zd.

"ServerCool Active Rear Door Heat Exchanger ADHX 35-6B [35kW]," ServerCool Units, 2018, pp. 1-4, Nortek Air Solutions, LLC, available at www.nortekair.com.

O3 Meallie, et al., U.S. Appl. No. 17/070,006, filed Oct. 14, 2020, pp. 1-22, U.S. Patent and Trademark Office, Alexandria, VA.

\* cited by examiner

ELECTRONICS CABINET COOLING SYSTEM

CROSS REFERENCE TO RELATED APPLICATIONS

This patent application is a continuation-in-part of U.S. patent application Ser. No. 17/313,392 filed on May 6, 2021, which is herein incorporated by reference in its entirety.

TECHNICAL FIELD

This disclosure relates to electronics cooling and, more particularly, to electronic cabinet cooling using heat exchangers mounted at an air discharge of a respective electronic cabinet.

BACKGROUND

Present cooling systems suffer from a variety of drawbacks, limitations, and disadvantages. Accordingly, there is a need for inventive systems, methods, components, and apparatuses described herein.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

Figure 1:
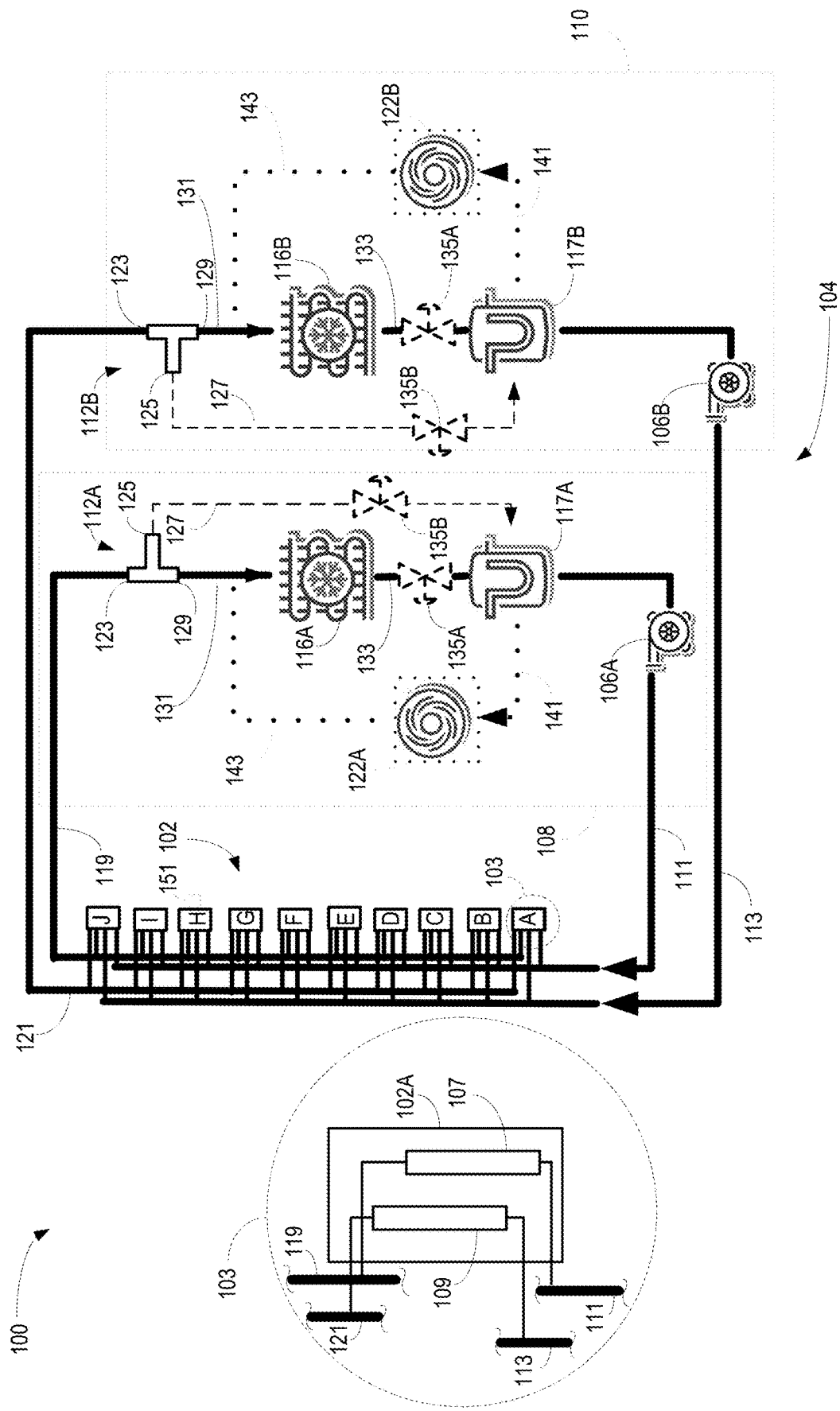
FIG. 1 illustrates an example of an electronic cabinet cooling system in an environment having multiple electronic cabinets.

An electronics cabinet cooling system includes one or more groups of heat exchangers. Each of the heat exchangers may be disposed at an air discharge of respective server electronic cabinets having server electronic components therein. In some examples, the heat exchangers may each be positioned on respective server cabinet doors in position to receive a flow of hot air moving from the server electronic components to the heat exchangers. In other examples, the heat exchangers may be mounted at an air discharge of respective server cabinets. The system may include at least one pump configured to pump a refrigerant as liquid refrigerant through the heat exchangers such that at least some of the refrigerant is changed from the liquid refrigerant to a gas refrigerant during transfer of heat from the flow of hot air to the refrigerant. The system may also include a common outlet header comprising a three-way tee. The combination of the liquid refrigerant and the gas refrigerant may be received from the heat exchangers into the common outlet header and directed to an entry to the three-way tee. The liquid refrigerant may be at least partially separated from the gas refrigerant such that the liquid refrigerant exits the three-way tee through a liquid exit, and the gas refrigerant exits the three-way tee through a vapor exit. The system may also include a condenser and a receiver. The condenser may be arranged in the system to change the gas refrigerant received from the vapor exit to the liquid refrigerant, and the receiver may receive the liquid refrigerant from the liquid exit of the three-way tee. The receiver may also receive liquid refrigerant from the condenser. The receiver may supply liquid refrigerant to the pump.

The electronics cabinet cooling system may include a two-phase pumped loop (TPPL). The two-phase pumped loop may include, a receiver (also referred to as a liquid receiver), a pump downstream from the receiver, one or more groups of cabinet heat exchangers, such as server cabinet heat exchangers, downstream from the pump, a three-way TPPL tee downstream from the heat load, a TPPL check valve downstream from a first outlet of the three-way TPPL tee, and a condenser downstream from the TPPL check valve and upstream from the receiver. The cooling system may further include or rely on supplemental cooling. Examples of supplemental cooling include an air conditioning system, a thermal storage system and a vapor cycle system (VCS) loop. The VCS may operate during a VCS mode via a vapor compressor and/or vapor compression. The vapor cycle system loop may include the receiver, a compressor downstream from a vapor outlet the receiver, a compressor check valve downstream from the compressor and upstream of the condenser, the condenser, and the cabinet heat exchangers downstream from the pump and/or a liquid outlet of the receiver.

The two-phase pumped loop may be configured to operate in a TPPL mode in which a refrigerant flows through the two-phase pumped loop due to the TPPL check valve being open and the compressor check valve being closed. During times of need for supplemental cooling, the vapor cycle system loop may be configured to operate in a VCS mode in which the refrigerant flows through the vapor cycle system loop due to the TPPL check valve being closed and the compressor check valve being open. Refrigerant may flow through the TPPL portion of the system in VCS mode, but refrigerant may stop flowing from the TPPL check valve to the condenser.

A method of cooling an electronics cabinet includes directing a refrigerant through a two-phase pumped loop due to a TPPL check valve being open and a compressor check valve being closed in a TPPL mode. The two phase pumped loop may include the receiver, the pump, one or more groups of heat exchangers downstream from the receiver, the three-way TPPL tee downstream from the heat load, the TPPL check valve downstream from the TPPL tee, and a condenser downstream from the TPPL check valve and upstream from the receiver. The method may further include providing supplemental cooling, such as by directing the refrigerant through a vapor cycle system (VCS) loop due to the TPPL check valve being closed and the compressor check valve being open in a VCS mode. The vapor cycle system loop may include the receiver, a compressor downstream from a vapor outlet of the receiver, the compressor check valve downstream from the compressor and upstream of the condenser, the condenser, and the heat load downstream from the pump and/or a liquid outlet of the receiver.

One interesting feature of the electronics cabinet cooling system described may be the ability of the electronics cabinet cooling system to operate in TPPL mode (two-phase pumped loop mode), with or without supplemental cooling, at substantially atmospheric pressures and in a temperature range that allows use of heat exchangers in the system constructed of one or more plastic polymers. Another interesting feature of the system is the capability to advantageously mount the heat exchangers constructed of plastic polymer(s) at an air discharge of respective electronic cabinets, or on respective doors of electronic cabinets, such as a rear server cabinet doors of respective server cabinets in a datacenter.

Another interesting feature of the electronics cabinet cooling system relates to operation in the TPPL mode without supplemental cooling by using a refrigerant that changes phase from liquid refrigerant to gas refrigerant in the heat exchangers in a range of 10 to 60 degrees Celsius at substantially atmospheric pressure. Operation in TPPL mode in situations where the difference in temperature between ambient air around a condenser included in the system and the heat load to be cooled ($\Delta t$) may be relatively high and sufficiently large enough for efficient and effective heat rejection by the condenser of the heat load from at least the cabinet heat exchangers. Additionally or alternatively, in particular applications where the heat load from at least the cabinet heat exchangers is sometimes not being effectively rejected by the condenser due to the difference in the temperature being below a predetermined threshold, supplemental cooling may be implemented with the TPPL mode.

Additionally or alternative, another interesting feature relates to the system optionally and selectively implement supplement cooling, such as with the VCS mode, in coordination with the TPPL mode in order to maintain sufficient cooling based on variations of the environment to which the heat is rejected, such as variations due to the seasons and/or the time of day (for example, day or night). The supplemental cooling, such as VCS mode may enable sub-ambient cooling for times when the ambient temperature to which heat is rejected exceeds the desired coolant delivery temperature.

FIG. 1 is a block diagram of an example electronic cabinet cooling system 100 in an environment having multiple electronic cabinets. The electronic cabinet cooling system 100 may be deployed in environments having multiple electronic cabinets, such as in a data center containing server computers housed in electronic cabinets. The electronic cabinet cooling system 100 includes cabinet heat exchangers 102 and a refrigerant management system 104 cooperatively operating as a two-phase pump loop (TPPL). The cabinet heat exchangers 102 may be disposed at an air discharge of a respective cabinet, or on a respective electronics cabinet door, such as a server cabinet door, in position to receive a flow of hot air flowing across the server electronic components to respective cabinet heat exchangers 102. In FIG. 1, cabinet heat exchangers 102A-102J are illustrated, however, in other examples fewer or greater numbers of heat exchangers 102 may be included. The flow of hot air may be induced by a fan, which may be positioned to blow air across the server electronic components, and/or induce the flow of air from the server electronic components to the heat exchanger.

To increase the cooling efficiency of the cabinet cooling system 100, the heat is gathered as close to the source as possible so that as large a temperature difference between the server electronic systems and the heat sink can be maintained. Larger temperature differences may result in a reduction in size of the heat exchangers. In examples, however, such as data centers, an important distinction in energy consumption is between being able to collect heat above ambient air temperatures and reject it directly to the atmosphere versus adding a vapor cycle system to provide cooling below ambient air temperatures. Computer processors, such as those in server computers, typically operate in the range of 60-70° C., while the hottest ambient air temperatures are 50° C. and typically much lower according to geographic location and time of year. Due to this 10° C. to 20° C. temperature difference between server computers and ambient temperatures, direct cooling may be achieved with the cabinet heat exchangers 102 carrying a refrigerant to extract excess heat.

The refrigerant is provided in parallel to the cabinet heat exchangers 102A-102J via the refrigerant management system 104. The refrigerant management system 104 in the example of FIG. 1 includes a first refrigerant loop 108 and a second refrigerant loop 110 to optimize cooling system reliability. In other examples, a single refrigerant loop, or more than two refrigerant loops may be deployed. The first loop 108 includes a first pump 106A, a first condenser 116A and a first receiver 117A. Accordingly, in this configuration, the first loop 108 and the second loop 110 are completely independent stand-alone systems such that if any component of the first loop 108 failed, there would be no impact on operation of the second loop 110. In other examples, the first loop 108 and the second loop 110 may have one or more common components, such as, for example, a single common receiver 117, condenser 116 and/or a compressor 122. In addition, in some examples, the first loop 108 may include a compressor 122A. The second loop 110 includes a second pump 106B, a second condenser 116B and a second receiver 117B. In addition, in some examples, the second loop 110 may include a second compressor 122B.

As illustrated by the more detailed illustration of cabinet heat exchanger 102A in the dotted line circle 103, each of the cabinet heat exchangers 102 of this example may include a first tube bundle 107 that is included in the first loop 108 and a second tube bundle 109 that is included in the second loop 110. In other examples, a single tube bundle or additional tube bundles may be included in the cabinet heat exchangers 102. The first tube bundle 107 is in liquid communication with the first pump 106A and the second tube bundle 109 is in liquid communication with the second pump 106B to create independent and standalone parallel flow paths for the refrigerant in the heat exchanger 102. In the illustrated example, in a single cabinet heat exchanger 102, the internal fluid volumes/tubes do not intermix. Using separate stand-alone tube bundles (107 and 109) and supporting refrigerant loops (108 and 110) with separate internal volumes make install/maintenance easier and reduces manufacturing costs. Although the piping of the first and second refrigerant loops 108 and 110 is redundant in some respects, the nominal pipe diameter is reduced, which makes pipe bends and routing easier.

In FIG. 1, during TPPL mode, liquid refrigerant pumped by the first pump 106A from the first receiver 117A into the cabinet heat exchangers 102 via a first common inlet header 111 is received by the first tube bundle 107 and liquid refrigerant pumped by the second pump 106B from the second receiver 117B into the cabinet heat exchangers 102 via a second common inlet header 113 is received by the second tube bundle 109 in each of the cabinet heat exchangers 102A-102J. At least some of the refrigerant is changed from the liquid refrigerant to a gas refrigerant during transfer of heat, by the cabinet heat exchanger 102, to the refrigerant. A first common outlet header 119 receives the combination of liquid refrigerant and gas refrigerant from the first tube bundle 107 of each of the heat exchangers 102. A second common outlet header 121 receives the combination of liquid refrigerant and gas refrigerant from the second tube bundle 109 of each of the heat exchangers 102. Since each of the cabinet heat exchangers 102 include a first tube bundle 107 operable in parallel with a second tube bundle 109, both the first tube bundle 107 and the second tube 109 may operate at 50% or less total heat absorption capacity to create redundancy within each of the cabinet heat exchangers 102.

Each of the first common outlet header 119 and the second common outlet header 121 includes a respective three-way tee 112, or TPPL tee, indicated as first three-way tee 112A and second three-way tee 112B in FIG. 1. The combination of the liquid refrigerant and the gas refrigerant received from the plurality of cabinet heat exchangers 102 into the common outlet header (119 and 121) is directed to an entry 123 of the three-way tee 112. Within the three-way tee 112, the liquid refrigerant may be separated from the gas refrigerant such that the liquid refrigerant exits the three-way tee through a liquid exit 125 into a bypass line 127, and the gas refrigerant exits the three-way tee 112 through a vapor exit 129 into a vapor refrigerant line 131. Liquid refrigerant in the bypass line 127 may be directed to the respective first and second receivers 117A and 117B. Gas refrigerant in the vapor refrigerant line 131 may be directed to the respective first and second condensers 116A and 116B, which change the gas refrigerant received from the vapor exit 129 to liquid refrigerant, which is then channeled to the respective first and second receivers 117A and 117B via a condensed liquid refrigerant line 133. The bypass line 127 and the liquid refrigerant line 133 may each include a respective control valve 135A and 135B to manage the appropriate distribution of the liquid/vapor between the bypass line 127 and the liquid refrigerant line 133 according to the pressure drop of the respective condensers 116A and 116B.

Creating custom cold plates to access the 'high grade' heat of the processors for each type of server may be prohibitively expensive. Thus, each of the cabinet heat exchangers 102 may, for example, be a rack mounted rear-door heat exchanger, or may replace a rear door, which can balance adaptability/retrofitability of the electronics cabinet heating/cooling system to existing hardware or new hardware while accessing relatively high-grade heat sources within respective electronic cabinets. In addition, the one or more tube bundles of the cabinet heat exchangers 102 may be constructed of a plastic polymer having a wall thickness to carry the liquid refrigerant received in the heat exchanger in a pressure range of between $2.0265 \times 10^4$ PA (0.2 atm) and $70.9275 \times 10^4$ PA (7 atm). The construction of the heat exchanger with plastic polymer(s) such as Nylon or High-Density Polyethylene may significantly reduce the weight and cost of the heat exchangers 102.

Figure 2:
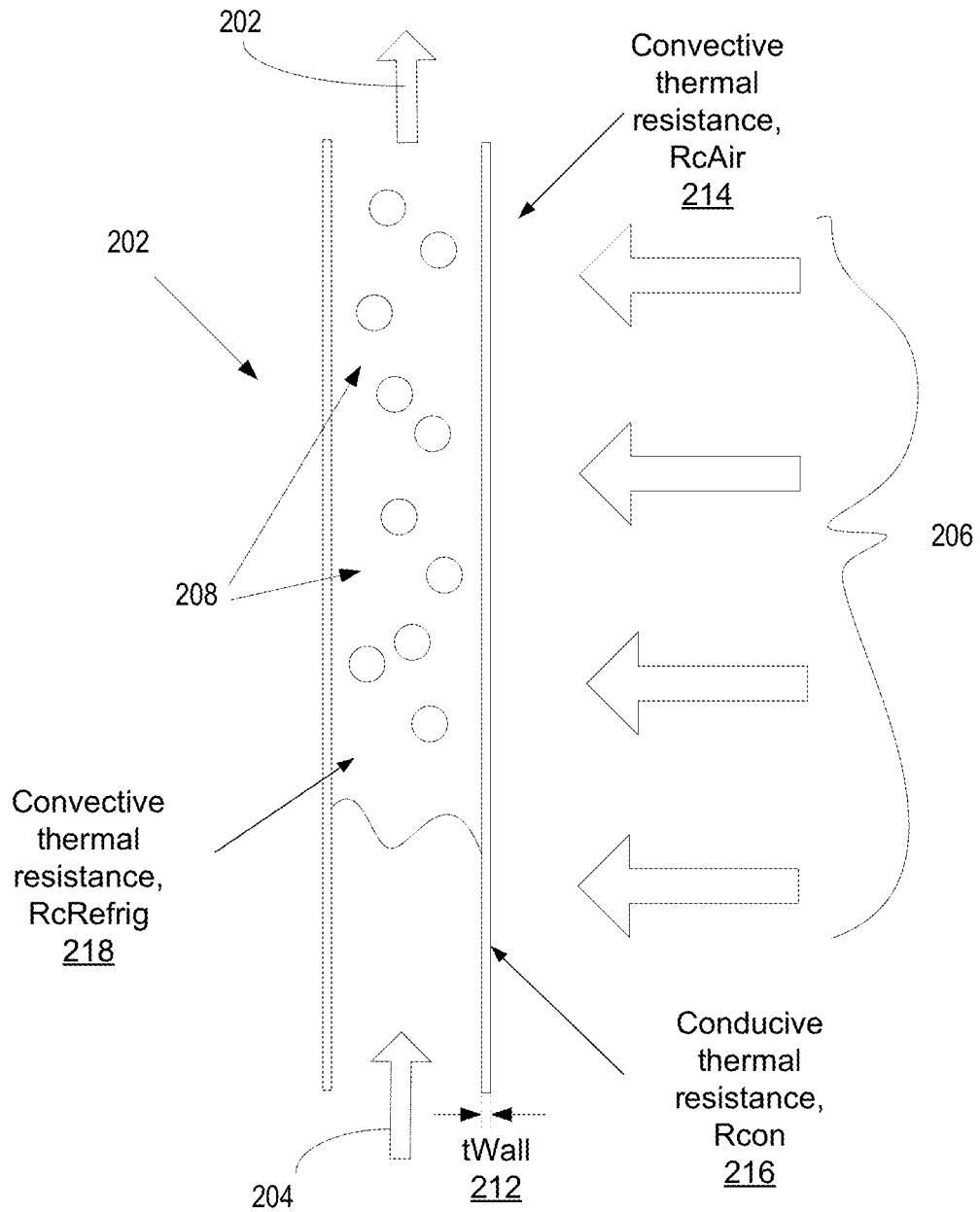
FIG. 2 is a schematic diagram of an example tube within a tube bundle of a cabinet heat exchanger as illustrated in FIG. 1.

FIG. 2 is a schematic diagram of an example tube 202 within a tube bundle of a cabinet heat exchanger 102 as illustrated in FIG. 1. The tube 202 receives a flow of liquid refrigerant 204 from the common inlet header 111 or 113. A flow of hot air 206 moving from the server electronic components to the cabinet heat exchangers flows around the tube 202, thereby transferring heat from flow of hot air 206 to the liquid refrigerant 204, causing at least some of the liquid refrigerant to change to gas refrigerant 208. Since the plastic polymer from which the tube 202 is constructed has a low thermal conductivity relative to metal heat or metal based heat exchanger materials, the thickness of the walls 212 of the tube 202 may be minimized to maximize the heat transfer. Total thermal resistance (Rtot) involved in the transfer of heat from the flow of hot air 206 to the refrigerant in the heat exchanger 102 may be modeled as:

$$Rtot = Rc\text{Air} + Rcon + Rc\text{Refrig} \qquad \text{Equation 1}$$

where the convective thermal resistance of flow of hot air 206 is RcAir 214, the tube wall conductive thermal resistance is Rcon 216 and the convective thermal resistance of the refrigerant is RcRefrig 218. Accordingly, total thermal resistance Rtot may be reduced by reducing the tube wall conductive thermal resistance (Rcon) of the tube 202. Calculation of the optimal wall thickness (tWall) 212 may be based on a hollow cylinder with convective surface conditions. As wall thickness (tWall) 212 of the tube 202 decreases the hoop strength or allowable stress in the pipe wall of the tube 202 without the possibility of failure also decreases. Since thin wall plastic has a relatively low hoop strength for piping applications, the delta pressure between the inside of the tube 202 and the outside of the tube 202 may dictate a minimum acceptable wall thickness (tWall) 212. Accordingly, the minimum acceptable wall thickness (tWall) 212 may be dictated not by minimizing tube wall conductive thermal resistance (Rcon) but by the pressure of the refrigerant being pumped through the tube 202.

Referring to FIGS. 1 and 2, in electronics cabinet cooling system 100, the pressure of the refrigerant in the tubes 202 of the cabinet heat exchangers 202 may be maintained advantageously low by using a refrigerant that changes phase from liquid refrigerant 204 to gas refrigerant 208 in the heat exchanger in a range of 10 to 60 degrees Celsius at substantially atmospheric pressure in TPPL mode. As a result, the wall thickness (tWall) 212 of the tubes 202 may be between 0.0178 millimeters and 0.381 millimeters (0.7-15 thousands) to optimize thermal transfer. The condensers 116A and 116B may also be constructed of thermoplastic or thermoset with similar wall thickness due to the relative low pressure operation of the system 100 in TPPL mode. The condensers 116A and 116B may also include fans, or some other mechanism to provide forced air cooling. The term "substantially" as used herein to describe atmospheric pressure means the pressure may vary by up to +/−10% of atmospheric pressure.

Referring again to FIG. 1, the electronic cabinet cooling system 100 may optionally also include supplemental cooling. Supplemental cooling may augment or otherwise provide additional cooling for the TPPL mode. Such supplemental cooling may be implemented as space air conditioning and/or air handling systems, thermal storage systems, and/or using a vapor cycle system (VCS) loop. Space air conditioning and/or air handling systems may be implemented to condition the air in the enclosure housing the electronic cabinet cooling system 100 and/or the electronic cabinets. For example, in the case of a datacenter housing server electronic cabinets, computer room air conditioner/computer room air handling systems (CRACS/CRAHS) may be present to provide supplemental cooling. Thermal storage systems may use water, ice or some other material to store and thermally extract supplemental cooling as needed. In addition, or alternatively, a vapor cycle system (VCS) may cooperatively operate with the TPPL mode using one or more compressors in the refrigerant management system 104 to provide a vapor cycle system (VCS) loop 138 for optional addition of the VCS mode to provide supplemental cooling.

In FIG. 1, each of the first and second loops 108 may optionally include a respective compressor 122A and 122B, as indicated by dotted lines. The compressor 122A and 122B may be centrifugal compressors, which may be selectively used/energized in applications where supplemental cooling with a VCS mode may be advantageous. Such supplemental cooling in the VCS mode may be selectively used in situations where the temperature differential between ambient temperature and the temperature of the heated flow of air dips below a predetermined threshold making rejection of the heat received from the server electronic components drop below a predetermined threshold level of efficiency.

For example, ambient temperatures in some locations, such as in Arizona in the summertime, may rise to the point where efficient condensing of the gas refrigerant to the liquid refrigerant by the respective condensers 116A and 116B in TPPL mode may be impacted for relatively short periods of time.

In an example, a predetermined threshold warranting selective energization/operation of the compressors 122A and 122B to temporarily implement VCS mode may be about 14%. In these examples, the term "about" is +/−2 degrees Celsius. Thus, in this example, when the refrigerant in the cabinet heat exchangers 102 are absorbing heat such that the refrigerant temperature in one or both of the common headers 119 and 121 is about 46 degrees Celsius and the ambient air temperature at the condensers 116A and 116B reaches 32 degrees Celsius, the compressors 122A and 122B may be automatically energized to operate in VCS mode and provide additional condensing capacity in the condensers 116A and 116B.

Operation of the respective compressors 122A and 122B to provide supplemental cooling in the compressor mode may occur according to a number of different predetermined control modes. For example, there may be at least two different supplemental cooling control modes for triggering supplemental cooling with the respective compressor 122A and 122B.

In a first supplemental cooling control mode, the TPPL pumps 106A and 106B may be operated at a constant speed and the liquid level and pressure in the respective receivers 117A and 117B may be monitored. In examples where the respective receivers 117A and 117B contain 2-phase refrigerant (liquid and vapor), once the pressure is known, the temperature is also known. During operation, the control objective in this first mode of supplemental cooling is to keep the pressure/temp in the respective receivers 117A and 117B relatively constant. If the liquid level is dropping and/or the pressure is increasing in the respective receiver 117A or 117B, and the control valve 135B on the bypass line 127 is fully closed that means that all the flow is going through the respective first or second condenser 116A or 116B, and that the respective first or second condensers 116A or 116B is no longer rejecting sufficient heat to match that which is being generated. Accordingly, the additional vapor in the system triggers the pressure to go up and the liquid level to go down in the respective receiver 117A or 117B. Upon detecting this condition, the respective compressor 122A or 122B may be energized to provide additional supplemental cooling capacity.

In the second supplemental cooling control mode a delta, or difference, in temperature between ambient temperature of the air around the respective condensers 116A and 116B may be monitored and compared to a temperature of the respective receiver 117A or 117B. Based on, for example, pre-determined system performance models, artificial intelligence models, and/or mapping, the respective compressor 122A or 122B may be energized when the temperature difference is below a threshold. For example, when the difference in temperature of ambient air around the condensers 116A and 116B and the respective receiver 117A or 117B drops below two to fifteen degrees C. Thus, for example, if the temperature difference was ten degrees C., and the refrigerant temperature in the respective receiver 117A or 117B was thirty deg C., then the respective compressor 122A or 122B would energized and start up if the ambient temperature exceeded twenty deg C.

During such high ambient temperature conditions, the system may operate with TPPL and in a compressor mode (activate VCS mode) where the compressors 122A and 122B may be selectively energized to receive liquid refrigerant from the respective receivers 117A and 117B on a compressor feed line 141, and output compressed refrigerant on a compressed refrigerant line 143, which may be supplied to the respective condensers 116A and 116B to increase the temperature differential thereby enabling conversion of refrigerant gas to refrigerant liquid. As discussed in detail elsewhere, check valves may be used to automatically initiate a compressor mode (activate VCS mode) when the compressors 122A and 122B are energized and begin providing pressurized refrigerant to supplement the TPPL mode.

In alternative examples, were the ambient air temperature does not rise to the level of impacting efficiency, such as in Alaska or in a temperature-controlled space, such as a server room, the first and second compressors 122A and 122B may be omitted and the system may operate only in TPPL mode. For example, in a temperature-controlled space a compressor mode (use of VCS mode) may be unnecessary due to the air conditioning (computer room air conditioner/computer room air handling systems (CRACS/CRAHS)) being controlled to provide some percentage of the cooling of the refrigerant in the condenser 116A and 116B as needed during TPPL mode according to the predetermined threshold. In still other alternative examples, the system may include thermal storage (not shown), such as a chilled water system or ice where cooling capacity supplementing the TPPL mode may be produced and stored when power consumption is low and/or power generation from sources such as renewable energy sources are plentiful. For example, the building where the servers are stored may already have a separate system that provides chilled water to the server room.

In implementations using a compressor mode that activates VCS mode during TPPL mode, corresponding compressors 122A and 122B, the condensers 116A and 116B may be subject to higher pressures warranting increased hoop strength of the tubes included in the condensers 116A and 116B. Thus, in these implementations, increased wall thickness of tubes in the condensers 116A and 116B and corresponding consideration of thermal efficiency may be warranted. Alternatively, the condensers 116A and 116B may be fabricated from materials other than plastic polymers, such as metal, to provide efficient thermal transfer and adequate hoop strength. Since, in some examples, the cabinet heat exchangers 102 may not be subject to the higher pressures provided by the compressors 122, the tubes of the cabinet heat exchangers 102 may by constructed of plastic polymers optimized for thermal transfer in TPPL mode as discussed. The electronic cabinet cooling system 100 may utilize cabinet heat exchangers 102 implemented in an air discharge or as rear-door heat exchangers made out of low-cost plastic material and a refrigerant that enables low pressure differentials (delta-p's) across the respective heat exchangers 102 to provide efficient and effective cooling of server computer components. Implementation of the cabinet heat exchangers 102 as air discharge or as rear door heat exchangers may be passive in that the flow of heated air may be forced through the respective cabinet heat exchangers 102 solely via the fan(s) in the servers or active where one or more additional fans 151 may be included in one or more of the cabinet heat exchangers 102 to increase the air flowrate therethrough. The cabinet heat exchangers 102 may be fabricated from multiple plastic parts such multiple separate plastic tubes or may be formed as a single monolithic part such as by injection molding, roto molding or vacuum forming for instance. Alternatively, fabrication of the heat exchangers 102 may be performed using conventional material removal methods, which may be performed at a much more rapid rate relative to metal fabrication due to the relatively easy machinability of plastic polymers.

The electronic cabinet cooling system 100 may be used in connection with supplemental cooling such as room cooling systems. Examples of existing or new room cooling systems include computer room air conditioner/computer room air handling systems (CRACS/CRAHS). Alternatively, the system 100 may supplant such systems and provide all of the cooling necessary where no supplemental cooling is warranted. The electronic cabinet cooling system 100 may also include devices and equipment, such as de-humidifiers to remove moisture and air that may intrude into the system from leaks if the working pressure of the system is below ambient pressure.

Thus, electronic cabinet cooling system 100 may include cabinet heat exchangers 102 which combine a low-cost plastic structure with a near ambient working pressure refrigerant to efficiently and effectively cool electronic components, such as server electronic components. Overall data center efficiency may be significantly increased relative to conventional data center cooling systems by the electronic cabinet cooling system 100 since in many geographic locations there is a significant portion of the year when no compressor mode (compressor-aided cooling in VCS mode) is necessary when heat generated by the electronic components may be adequately captured from the back of the server by the electronic cabinet cooling system 100.

For example, the relatively low cost of the cabinet heat exchangers 102 formed from plastic polymers may deliver a relatively good rate of return on investment (ROI). The electronic cabinet cooling system 100 may also be retrofitted to existing electronic cabinets, such as existing server cabinets in existing data centers. Since the flow of hot air from the electronic components is immediately cooled after exiting the electronic rack, such as a server rack, racks can be placed closer together reducing real estate costs for the computing center. Also, the ambient environment of the computing center may be improved for maintenance personnel and operators since variations in ambient temperatures among different regions of such computing centers may be minimized. Moreover, ambient noise may be significantly reduced in facilities with existing CRAC/CRAH systems, since the CRAC/CRAH fans and other components may be run at a lower cooling capacity, or not at all, due to cooling provided by the electronic cabinet cooling system 100. Also, many data centers use raised floors for airflow distribution underneath the servers and to route cables. The raised floors are often expensive to install and can limit the weight of the electronic cabinets and servers. With the electronic cabinet cooling system 100 airflow distribution below the flow may be significantly eliminated. Thus, the height of the raised floor may be reduced (assuming a raised floor is still needed for cable management) or eliminated if overhead cable management and piping is used. Additionally, many data centers often have to re-calibrate the distribution and size of perforated tiles in raised floors due to upgrades or changes in IT equipment. Elimination of the need for a raised floor may also minimize costs of upgrades or changes in IT equipment.

In an example implementation, one of the cabinet heat exchangers 102 may be capable of removing 40 kW of heat energy from refrigerant at 100% nominal exit quality (e.g. when 100% of the liquid refrigerant is changed to gas). In other examples, one of the cabinet heat exchangers 102 may be capable of removing 1-5 kW of heat energy from refrigerant at 100% nominal exit quality (e.g. when 100% of the liquid refrigerant is changed to gas). In still other examples, one of the cabinet heat exchangers 102 may be capable of removing 5-10 kW of heat energy from refrigerant at 100% nominal exit quality (e.g. when 100% of the liquid refrigerant is changed to gas).

In an example, each of the tube bundles 107 and 109 may have a nominal exit quality of 0.5. If one of the tube bundles 107 or 109 or corresponding refrigerant loop 108 and 110 fails, such as by a pump failure, complete system leak, and the like, all heat from the flow of hot air flowing through the heat exchanger may automatically be rejected by the remaining operable tube bundle 107 or 109 and refrigerant loop 108 and 110. Thus, the remaining operable tube bundle 107 or 109 may run an exit quality of ~1. Due to the increased exit quality, and therefore increased level of gas refrigerant exiting the affected heat exchanger 102, the percentage of vapor in the cooling loop may increase, and the remaining refrigerant loop may successfully reject the heat in the respective condenser 116A or 116B to return the gas refrigerant to liquid refrigerant.

Accordingly, redundancy of the tube bundles 107 or 109 and refrigerant loops 108 and 110 is achieved. During example operation, an exit quality of 50% or less may be used in the first and second tube bundle refrigeration loops. During, for example, a failure or mis operation of the first tube bundle loop, the second tube bundle loop may successfully run up to 100% quality, thereby absorbing all the heat and keeping the servers from overheating, In addition, in implementations using supplemental cooling, such as a compressor 122A and 122B for selective addition of VCS mode, or a room cooling system such as a CRACS/CRAHS, or a thermal storage system, shortfalls in the condenser 116A or 116B being able to change the gas refrigerant to liquid refrigerant may be compensated by energizing the respective compressor or CRACS/CRAHS or thermal management system to provide supplemental cooling. For example, when a compressor 122 is present, the condenser 116 may be sized for nominal heat rejection, such as 125 kW, if one of the refrigeration loops fails, the compressor in the operable refrigeration loop may my turn on, or if it is already on, may spool to higher discharge temp which increases heat rejection of the condenser to 250 kW. Also, in systems with large numbers of electronics cabinets, the electronics cabinet cooling system 100 may be deployed for a predetermined subgroup of cabinets, such as fifty server racks or one hundred server racks. In the example or groups of fifty server racks, in a worst-case scenario of complete system failure (both refrigeration loops), only fifty racks are affected while the other groups of electronic cabinets are unaffected. Similarly, in a situation where one of the two refrigeration loops fails, the increased heat load on the remaining operational refrigeration loop will only affect fifty electronic cabinets.

In addition to using plastic polymers for the tube bundles in the heat exchangers 102, plastic tubing may also be used for supply and distribution of refrigerant to the heat exchangers 102 and collection of said refrigerant from the heat exchangers 102. For example, the electronic cabinet cooling system 100 may use plastic such as cross-linked polyethylene, commonly abbreviated PEX, XPE or XLPE, which is a form of polyethylene with cross-links.

In an example installation, the TPPL pumps 106A and 106B may receive power from an uninterruptible power supply (UPS). The data center servers and other equipment may also receive power from the UPS. The compressors 122A and 122B may, on the other hand, receive power directly from a utility grid. In this configuration, during a loss of power supplied by the local power company to the utility grid, continuous cooling may still be provided since the TPPL pumps 106A and 106B may still operate. In large refrigeration systems, there may typically be significant inertia such that turning off the compressor 122A or 122B for ~5 min during supplemental cooling while backup generators are being spun up to supply power, is likely to not to significantly impact the supplemental cooling being provide. Also, operation of the pumps 106A and 106B need not be kept continuously running during this time. In addition, the power draw of the pumps 106A and 106B may be relatively low, thereby making the pumps 106A and 106B represent relatively small loads on the UPS during a utility grid power outage.

Figure 3:
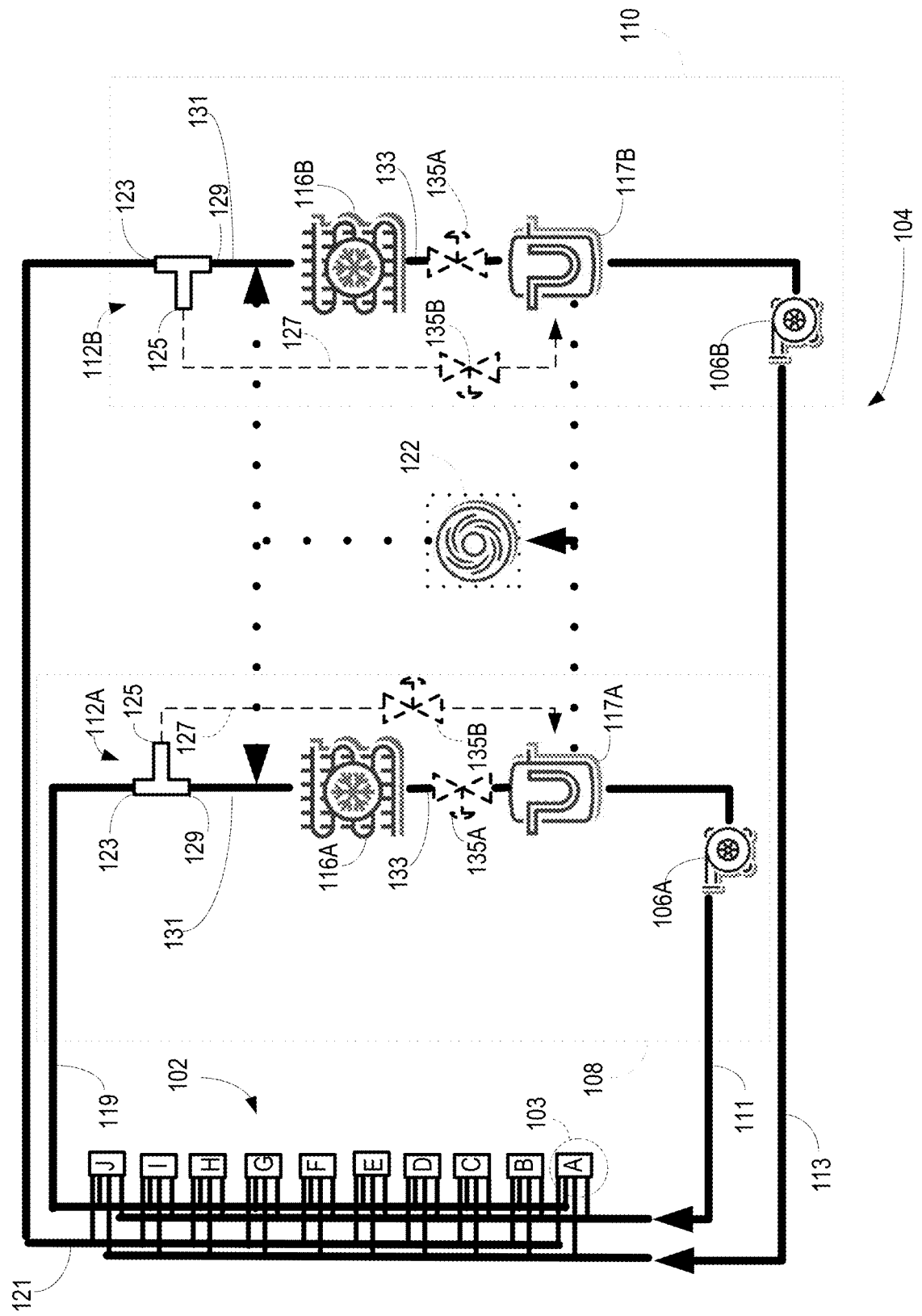
FIG. 3 is a block diagram of another example electronic cabinet cooling system in an environment having multiple electronic cabinets.

FIG. 3 is a block diagram of an example electronic cabinet cooling system 300 in an environment having multiple electronic cabinets. Similar to the example system of FIG. 1, the electronic cabinet cooling system 300 includes cabinet heat exchangers 102 and a refrigerant management system 104 cooperatively operating as a two-phase pump loop (TPPL). Supplemental cooling, such as with a vapor cycle system (VCS) loop 138 may also optionally be included in the refrigerant management system 104 if warranted. Unless otherwise indicated, the features and functionality of the electronic cabinet cooling system 100 (FIGS. 1 & 2) are similar. Accordingly, for purposes of brevity the details of these features and functionality will not be repeated, however, it should be understood that such features and functionality are fully interchangeable, combinable, and/or useable in either the electronic cabinet cooling system 100 or the electronic cabinet cooling system 300, unless otherwise indicated.

The compressor 122, which is optionally for VCS mode supplemental cooling, is selectively energized/operated according to the ambient air temperature exceeding a threshold value to provide additional cooling, as discussed herein. In the illustrated example, the compressor 122 is shared between two of the refrigerant loops 108 and 110. In other examples, more than two refrigerant loops may share the compressor 122. During operation, when energized for VCS mode, the shared compressor 122 may provide compressed refrigerant to both the first heat exchanger 116A and the second heat exchanger 116B. The shared compressor 122 reduces the install cost of this relatively expensive component in the system and enables 'upsizing' of the capacity of the compressor 122, which may be desirable for efficiency/availability.

Although this may create a point of non-redundancy in the system, the average system would only use the compressor 122 selectively when the ambient temperature at the condensers 116A and 116B exceeds the temperature threshold, or other discussed situations where the compressor 122 is selectively energized to provide additional cooling. In an example, the compressor 122 may be used approximately 50% of the time or less that the electronic cabinet cooling system 300 is operational. In addition, in examples where the cabinet heat exchangers 102 are grouped within different refrigerant management systems 104, absence of this redundancy would only affect a group of the cabinet heat exchangers 102 in the first and second refrigerant loops 108 and 110, other cabinet heat exchangers 102 in other loops/groups, such as other groups of server racks in a data center would be unaffected.

As also illustrated in FIG. 3, use of the compressor 122 as a shared compressor introduces refrigerant 'mixing' between the first and second refrigerant loops 108 and 110, which could enable a single leak in the system to compromise operation of the entire electronic cabinet cooling system. In examples, check values, solenoid valves, velocity fuses (as described in U.S. patent application Ser. No. 16/952,809 filed Nov. 19, 2020, which is incorporated by reference, in its entirety), or some other form of controlled and/or automated valve may be included in the electronic cabinet cooling system 300 and used to isolate leaks, as discussed herein.

Figure 4:
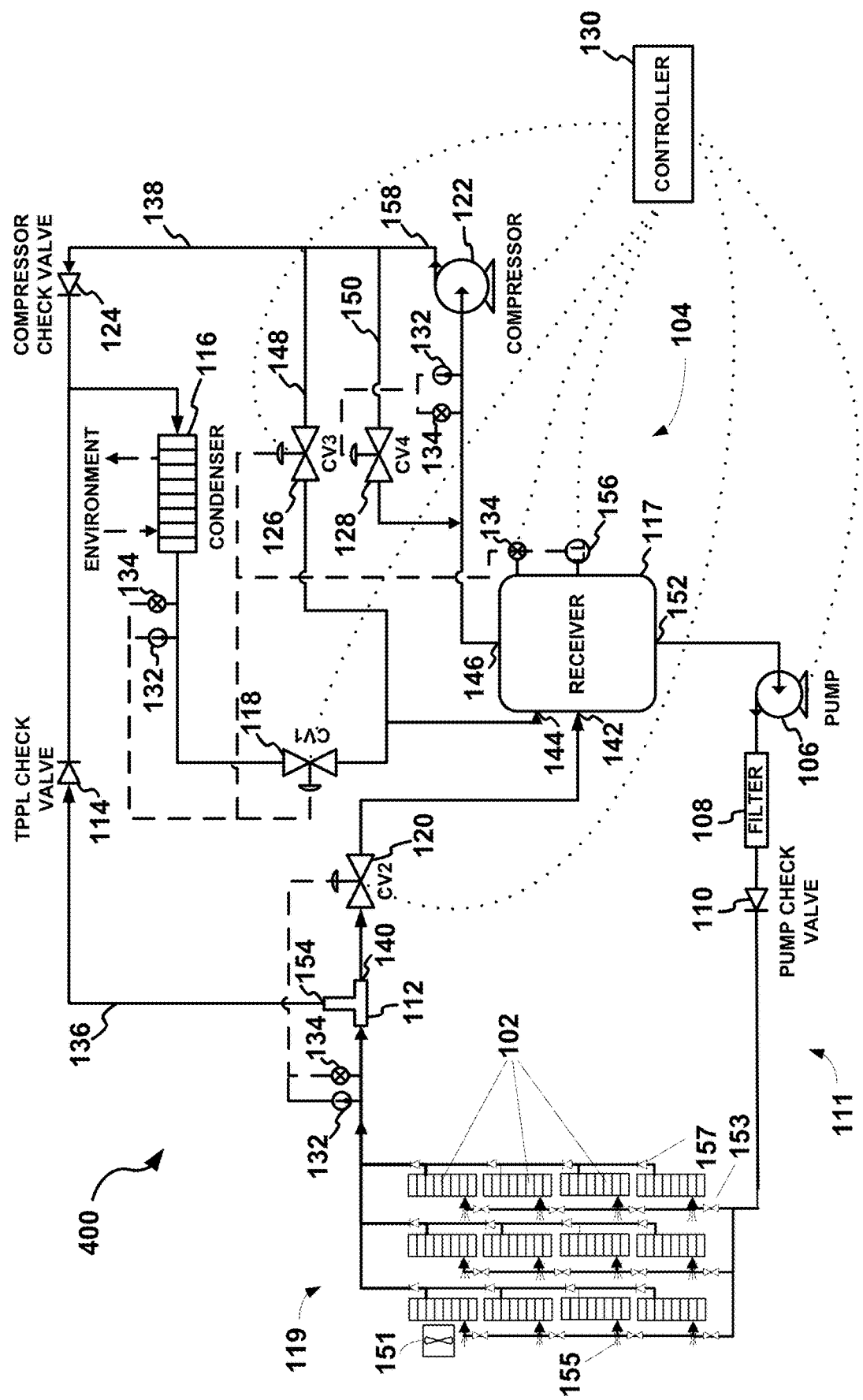
FIG. 4 is a schematic of another example electronic cabinet cooling system in an environment having multiple electronic cabinets.

FIG. 4 is a schematic of an example electronic cabinet cooling system 400 in an environment having multiple electronic cabinets. Similar to the example systems of FIGS. 1-3, the electronic cabinet cooling system 400 includes cabinet heat exchangers 102 and a refrigerant management system 104 cooperatively operating as a two-phase pump loop (TPPL). Supplemental cooling, such as using a vapor cycle system (VCS) loop 138 may also optionally be included in the refrigerant management system 104 for selective energization/use. Unless otherwise indicated, the features and functionality of the electronic cabinet cooling system 100 and 300 (FIGS. 1-3) are similar. Accordingly, for purposes of brevity the details of these features and functionality will not be repeated, however, it should be understood that such features and functionality are fully interchangeable, combinable, and/or useable in either the electronic cabinet cooling system 100, the electronic cabinet cooling system 300, or the electronic cabinet cooling system 400, unless otherwise indicated.

The illustrated example of the electronic cabinet cooling system 400 includes a receiver 117, a pump 106, a filter 108, a pump check valve 110, the group of cabinet heat exchangers 102, one or more optional fans 151 for additional airflow cooling, heat exchanger isolation valves 153, heat exchanger orifices 155, heat exchanger check valves 157, a three-way tee 112 (or TPL tee 112), a two-phase pumped loop (TPPL) check valve 114, a condenser 116, a first control valve (CV1) 118, a second control valve (CV2) 120, a compressor 122, a compressor check valve 124, a third control valve (CV3) 126, a fourth control valve (CV4) 128, a controller circuitry 130, one or more temperature sensors 132, one or more pressure sensors 134, one or more liquid level sensors 156, a two-phase pumped loop (TPPL) 136, and a vapor cycle system (VCS) loop 138.

In TPPL mode, the TPPL 136 may include the receiver 117, the pump 106, the filter 108, the pump check valve 110, the cabinet heat exchanger 102, the one or more optional fans 151, the heat exchanger isolation valves 153, the heat exchanger orifices 155, the heat exchanger check valves 157, the TPPL tee 112, the TPPL check valve 114, the condenser 116, the first control valve 118, one or more of the temperature sensors 132, one or more liquid level sensors 156, and one or more of the pressure sensors 134. The pump 106 may be downstream from a liquid outlet 152 of the receiver 117 and the filter 108 may be downstream from the pump 106. The pump check valve 110 may be downstream of the filter 108 and pump 106 and upstream of the cabinet heat exchangers 102 in the common inlet header line 111. The cabinet heat exchangers 102 may be downstream from the receiver 117, the pump 106, the filter 108, and the pump check valve 110. In the illustrated example, twelve cabinet heat exchangers 102 are illustrated. The cabinet heat exchangers 102 may be supplied refrigerant in a parallel configuration from the inlet header 111 in groups of four. In other examples, different numbers of cabinet heat exchangers 102 and different groupings are possible.

The heat exchanger isolation valves 153 and the heat exchanger orifices 155 may be position in the common inlet header line 111 upstream of an inlet of each respective cabinet heat exchanger 102. The isolation valves 153 may be manual or automated valves that provide a shutoff for flow of refrigerant from the inlet header 111 to the respective cabinet heat exchanger 102. The isolation valves 153 may be independently operated as a service valve to allow maintenance or replacement with the electronics cabinet or the respective cabinet heat exchanger 102 or group of cabinet heat exchangers 102. The heat exchanger orifices 155 may provide a restriction at the inlet to a respective cabinet heat exchanger 102.

The orifices 155 may be sized to manage equilibrium of flow of the refrigerant to respective cabinet heat exchangers 102. Thus, a predetermined opening size, such as a diameter size, of the orifice restriction may be different for respective cabinet heat exchangers 102. Such differences in orifice size may be used to adjust the pressure drop across respective cabinet heat exchangers 102 as part of refrigerant flow equalization. The differences in the size of the restriction may be based on, for example, the refrigerant flow distribution among different cabinet heat exchangers 102.

In examples, different cabinet heat exchangers 102 may have different heat removal capabilities according to the heat output from the electronic components in the respective cabinet. For example, a higher density electronic cabinet having a relatively large amount of heat generating electronic components may have a respective cabinet heat exchanger 102 with a relatively large orifice to provide relatively high refrigerant flow, whereas an electronic cabinet with relatively few heat producing components may have a relatively small orifice to provide relatively low refrigerant flow. In addition, an electronic cabinet with relatively intermediate heat generating electronic components may have a respective cabinet heat exchanger 102 with a relatively intermediate size orifice to provide relatively intermediate refrigerant flow. Thus, in any given system, orifices 155 of different respective cabinet heat exchangers 102 may be sized differently, or the same, or some combination of different and the same according to the heat load in the respective electronic cabinets.

In some examples, in accordance with the pressures in the system, the orifices 155 may also provide a flow control function by controlling sudden large changes in inlet flow of refrigerant, such as for example, during a sudden refrigerant leak situation, such as a line break or tube failure. Upon sensing a sudden change in flow rate into a respective cabinet heat exchanger 102, a respective orifice 155 may mechanically or electromechanically close to stop additional flow of refrigerant into the respective cabinet heat exchanger 102. An example of a mechanically actuated orifice is a velocity fuse, which is further described in U.S. patent application Ser. No. 16/952,809 filed Nov. 19, 2020, which is incorporated by reference, in its entirety, in the present disclosure.

The heat exchanger check valves 157 are downstream of an outlet of each respective cabinet heat exchanger 102 in a common outlet header line 119. The check valves 157 prevent upstream flow of refrigerant into the outlet of each respective cabinet heat exchanger 102, such as due to leaks or downstream pressurization. The cabinet heat exchangers 102 may be coupled in parallel with respect to the common outlet header line 119. In addition, the cabinet heat exchangers 102 may be grouped as described. In configurations where the cabinet heat exchangers 102 are grouped, such as in groups of four as illustrated in FIG. 4, downstream check valves 157 in a group may prevent backflow to not only its respective cabinet heat exchanger 102, but also upstream cabinet heat exchangers 102 in the group.

The three-way TPPL tee 112 may be downstream from the cabinet heat exchangers 102 and upstream of the condenser 116 and the receiver 117. For example, a first outlet 154 of the three-way TPPL tee 112 may be a gas refrigerant outlet in fluid communication with an inlet of the condenser 116, and a second outlet 140 of the three-way TPPL tee 112 may be a liquid refrigerant outlet in fluid communication with a first inlet 142 of the receiver 117. The TPPL check valve 114 may be disposed downstream of the first outlet 154 of the three-way TPPL tee 112 between the TPPL tee 112 and the condenser 116. The condenser 116 may be downstream of the TPPL tee 112 and the TPPL check valve 114 and upstream of the receiver 117. The first control valve (CV1) 118 may be disposed downstream of the condenser 116, between the condenser 116 and a second inlet 144 of the receiver 117. The second control valve (CV2) 120 may be disposed downstream of the second outlet 140 of the TPPL tee 112, between the three-way TPPL tee 112 and the first inlet 142 of the receiver 117.

Supplemental cooling, such as the VCS loop 138, may be optionally included in the electronic cabinet cooling system 400 and be selectively operated for additional cooling, such as at such times where a temperature differential between ambient temperature and the temperature of the heated flow of air received by the cabinet heat exchangers 102 dips below a predetermined threshold. In the illustrated example, the VCS loop 138 may include the receiver 117, the compressor 122, the compressor check valve 124, the condenser 116, the first control valve 118, the third control valve 126, the fourth control valve 128, one or more of the temperature sensors 132, one or more liquid level sensors 156, and/or one or more of the pressure sensors 134. The compressor 122 may be downstream of and in fluid communication with a vapor outlet 146 of the receiver 117. The compressor check valve 124 may be disposed downstream of the compressor 122 and upstream of the condenser 116.

The third control valve 126 may be disposed downstream of the compressor 122 and upstream of the receiver 117. The third control valve may be disposed on a bypass line 148 that extends from downstream of the compressor 122 to upstream of the second inlet 144 the receiver 117. The fourth control valve 128 may be disposed downstream of the compressor 122 on a recycle line 150. The recycle line 150 may extend from downstream of the outlet of the compressor 122 back upstream to between the vapor outlet 146 of the receiver 117 and the inlet of the compressor 122. The bypass line 148 and the recycle line 150 may each split off from a compressor discharge line 158 extending between the compressor 122 and the condenser 116.

The pressure sensors 134, liquid level sensors 156, and/or temperature sensors 132 may be disposed throughout the refrigerant management system 104. For example, a pressure sensor 134 and/or a temperature sensor 132 may be disposed upstream of the three-way TPPL tee 112 and be in communication with the second control valve 120. Additionally or alternatively, a pressure sensor 134 and/or a temperature sensor 132 may be disposed downstream of the condenser 116 and be in communication with the first control valve 118 and/or the third control valve 126. Additionally or alternatively, a pressure sensor 134 and/or a temperature sensor 132 may be disposed upstream of the compressor 122 and be in communication with the fourth control valve 128. Additionally or alternatively, a pressure sensor 134, a liquid level sensor 156, and/or a temperature sensor 132 may be disposed on the receiver 117 and may be in communication with the third control valve 126.

Additionally or alternatively, the pressure sensors 134, the temperature sensors 132, the first control valve 118, the second control valve 120, the third control valve 126, and/or the fourth control valve 128 may be in communication with the controller circuitry 130. The controller circuitry 130 may, for example, direct the valve 118, 120, 126, 128 positions. The system 100 may operate with distributed control (where each valve 118, 120, 126, 128 has its own control algorithm) and/or with coordinated control (where the sensors 132, 134, 156 feed into the controller circuitry 130 and the controller circuitry 130 sends commands to each valve 118, 120, 126, 128). For clarity, FIGS. 4 and 5 do not have dotted lines drawn to every sensor 132, 134, 156 and/or control valve 120, 118, 126, 128. However, it should be understood that some and/or all of the sensors 132, 134, 156 and/or control valves 120, 118, 126, 128 may be in communication with the controller circuitry 130.

Additionally or alternatively, the controller circuitry 130 may include a plurality of controllers. For example, the sensors 132, 134, 156 and/or control valves 120, 118, 126, 128 may be controlled by a combination of multiple controllers, wherein some or all of the sensors 132, 134, 156 and/or control valves 120, 118, 126, 128 may be controlled by separate controllers. The receiver 117 may be any vessel capable of receiving and storing a refrigerant. The refrigerant may be, for example, a liquid, vapor, and/or a liquid-vapor mixture. For example, the refrigerant may be a two-phase refrigerant. Additionally or alternatively, the receiver 117 may be a liquid-vapor separator, for example, the receiver 117 may be any vessel capable of receiving the refrigerant, separating the refrigerant into a liquid and a vapor, and storing the liquid and vapor in separate portions of the receiver 117. The receiver 117 may be, for example, a tank.

The receiver 117 may, for example, separate the refrigerant using gravity. For example the refrigerant may enter the receiver 117 from one or more inlets, a liquid component of the refrigerant may be pulled towards the bottom of the receiver 117 by gravity, and a vapor component of the refrigerant may stay towards the top of the receiver 117. The receiver 117 may have internal devices or features to further encourage liquid-vapor separation.

The receiver 117 may have one or more inlets, for example the first inlet 142 and/or the second inlet 144, to receive the refrigerant from one or more components of the electronics cabinet cooling system 400. For example, the receiver 117 may have one or more inlets on the top and/or side of the receiver 117. For example, the first inlet 142 may be disposed on the side of the receiver 117, and the second inlet 144 may be disposed on the side of the receiver 117 above the first inlet 142. Additionally or alternatively, the second inlet 144 may be at the same height as the first inlet 142, but at a different circumferential position than the first inlet 142, for example when the receiver 117 is cylindrical. Additionally or alternatively, the first inlet 142 and/or the second inlet 144 may be disposed on the top of the receiver 117 opposite the bottom.

The receiver 117 may have one or more outlets, for example the liquid outlet 152 and/or the vapor outlet 146, for providing the refrigerant to one or more components of the refrigerant management system 104. For example, the liquid outlet 152 may be disposed on the bottom of the receiver 117 and/or the vapor outlet 146 may be disposed on the top of receiver 117 opposite the bottom. Vapor may be supplied from the vapor outlet 146 and/or liquid may be supplied from the liquid outlet 152. Additionally or alternatively, a mix of vapor and liquid may be supplied from the vapor outlet 146 and/or from the liquid outlet 152.

The pump 106 may be any device capable of pumping the refrigerant from the receiver 117 to the cabinet heat exchangers 102 via the common inlet header 111. For example, the pump 106 may be a positive displacement pump, a centrifugal pump, and/or any similar type of pump device. The pump 106, for example, may be designed with a relatively low pressure suction head capability.

The filter 108 positioned in the common inlet header 111 may be any device capable of filtering and removing debris and/or contaminates from the refrigerant. The filter 108 may be a refrigerant 'filter-drier' combination which serves the function of both removing water from the system as well as filtering the liquid refrigerant. Additionally or alternatively, the filter may be of a mesh screen type with mesh sizes selected to prevent clogging of downstream components within the system.

The pump check valve 110, the TPPL check valve 114, and/or the compressor check valve 124 may be any device capable of allowing flow in only one direction, or preventing flow reversal. For example, the check valves 110, 114, 124 may be a mechanical check valve with a door that closes when the flow of refrigerant reverses direction. For example, the TPPL check valve 114 may only allow a flow of refrigerant from the TPPL tee 112 to the condenser 116. Additionally or alternatively, the compressor check valve 124 may only allow a flow of refrigerant from the compressor 122 to the condenser 116. Additionally or alternatively, the pump check valve 110 may only allow a flow of refrigerant from the pump 106 to the cabinet heat exchangers 102.

The cabinet heat exchangers 102 may be cabinet mounted, such as at an air discharge or in a cabinet door, and operable to transfer heat to the refrigerant from a flow of hot air received from electronic components, such as server electronic components in a server rack. The cabinet heat exchangers 102 may be, for example, a tube-in-tube heat exchanger, a shell-and-tube heat exchanger, a plate heat exchanger, and/or any similar heat transfer system or device. The cabinet heat exchangers 102 may extracting heat from a heat load of the electronic cabinet cooling system 400, such as server racks in a datacenter. In addition, the heat load may include other items cooled by the electronic cabinet cooling system 400, such as, for example, an LED, a laser, accessory electronics, a generator, an engine, and/or a discrete component configured to thermally be part of the heat load. Additionally or alternatively, a cold plate may be thermally coupled and be part of the heat load and may have passages through which the refrigerant flows and evaporates. Such cold plates may, for example, be installed within or contiguously adjacent the electronics components. The heat load may include the flow of hot air received from electronic components, the flow of hot air received from electronic components and thermal energy of one or more discrete additional heat load components, or it could represent the flow of hot air received from electronic components and thermal energy received from a plurality of heat loads distributed in various series and/or parallel arrangements.

The three-way tee TTPL 112 may be any device that separates the refrigerant into a liquid and a vapor. The three-way TPPL tee 112 may separate the liquid and the vapor using, for example, gravity. For example, the TPPL tee 112 may include, for example, a venturi tube, a venturi scrubber, and/or a T-shaped separator. The T-shaped separator may be, for example, a T-joint. The TPPL tee 112 may include a lower portion of a T-joint that comprises a straight portion connecting the inlet of the TPPL tee 112 to the liquid (or second) outlet 140 of the TPPL tee 112. Additionally, the TPPL tee 112 may include an upper portion of a T-joint that splits off from the straight, lower portion. The upper portion may connect the inlet of the TPPL tee 112 to the first outlet 154 of the TPPL tee 112.

The refrigerant may flow through the inlet of the TPPL tee 112, and due to gravity, the liquid portion of the refrigerant may be in the lower portion of the TPPL tee 112. The liquid may flow from the inlet of the TPPL tee 112, through the lower portion of the TPPL tee 112, through the second outlet 140, through the second control valve 120, and to the first inlet 142 of the receiver 117. Additionally or alternatively, refrigerant may flow through the inlet of the TPPL tee 112, and the vapor may rise into the upper portion of the TPPL tee 112. The vapor may flow through the inlet of the TPPL tee 112, through the upper portion, through the first outlet 154, and to the TPPL check valve 114.

The first control valve 118, the second control valve 120, the third control valve 126, and/or the fourth control valve 128 may be any type of valve capable of receiving input from the controller circuitry 130 and adjusting the volume flow rate and/or mass flow rate of refrigerant flowing through the control valve. For example, the first control valve 118, the second control valve 120, the third control valve 126, and/or the fourth control valve 128 may be control valves that allow for a variable degree of opening and may be able to increase or decrease the degree of opening of the control valve based on controller circuitry 130 feedback. The control valves 118, 120, 126, 128 may be, for example, in-line valves, gate valves, in-line gate valves, manual operated valves, pneumatic valves, motor valves, and/or hydraulic valves.

The condenser 116 may be any device capable of transferring and/or absorbing heat from the refrigerant. For example, the condenser 116 may transfer heat from the refrigerant to the ambient environment of the electronics cabinet cooling system 400. The condenser 116 may be, for example, a parallel-flow heat exchanger, a counter flow heat exchanger, a multi-pass flow heat exchanger, and/or a cross flow heat exchanger. The refrigerant may fill the hot-side channels of the condenser 116 while the ambient environment (for example, air, water, seawater) may fill the cold side channels of the condenser 116.

The compressor 122 may be any device capable of drawing refrigerant from the receiver 117, compressing the refrigerant, and pushing the refrigerant through the VCS loop 138. The compressor 122 may be electrically connected to the controller circuitry 130. The controller 103 may control the operation of the compressor 122, for example, turning the compressor 122 on or off, and/or controlling the volume flow rate or mass flow rate of refrigerant through the compressor 122.

The controller circuitry 130 may be any device capable of receiving sensor signals from the pressure sensors 134 and temperature sensors 132 and transmitting control signals to the first control valve 118, the second control valve 120, the third control valve 126, and/or the fourth control valve 128 accordingly. The controller circuitry 130 may include, for example, a processor circuitry and memory circuitry. The controller circuitry 130 may, for example, electrically control the control valves 118, 120, 126, 128 based on a target temperature, pressure, and/or flow rate of the electronics cabinet cooling system 400. Examples of the controller circuitry 130 may include a processor circuitry, programmable logic controller (PLC), a computer, a laptop, a microcontroller, or any other logic-based executable device.

During operation, the electronics cabinet cooling system 400 may operate as a two-phase pumped loop (TPPL) and optionally include supplemental cooling, such as by selective operation of a vapor cycle system (VCS). During TPPL operation, the refrigerant may flow from the liquid outlet 152 of the receiver 117, downstream to the pump 106, through the filter 108, and through the pump check valve 110. The pump check valve 110 may preclude refrigerant from flowing through the pump check valve 110 towards the filter 108 and the pump 106. The refrigerant may flow from the pump check valve 110 to the cabinet heat exchangers 102 via the common inlet header 111. The cabinet heat exchangers 102 may transfer heat, for example, from the flow of heated air from server electronic components and a target heat load to the refrigerant flowing through the respective cabinet heat exchangers 102. The refrigerant may absorb the transferred heat from the flow of heated air from server electronic components. As the refrigerant absorbs heat, at least a portion of the refrigerant may transform from liquid to vapor.

In TPPL operation, the refrigerant may flow from the respective cabinet heat exchangers 102 to the three-way TPPL tee 112. At least a portion of the refrigerant, including at least a portion the liquid component of the refrigerant, may flow through the lower portion of the TPPL tee 112, out the second outlet 140 (liquid outlet) of the TPPL tee 112, through the second control valve 120, and back to the receiver 117 through the first inlet 142. A portion of the vapor component of the refrigerant may also flow as a gas through the second outlet 140 (liquid outlet) of the TPPL tee 112 and through the second control valve 120. The second control valve 120 may be controlled, such as by the controller 130, to variably allow at least some vapor to flow through the second control valve 120 in order to control and/or maintain a target temperature at the cabinet heat exchangers 102.

For example, the second control valve 120 may modulate toward a fully open position or fully closed position based on feedback from a sensor, such as the pressure sensor 134 and the temperature sensor 132 disposed between the cabinet heat exchanger 102 and the TPPL tee 112 in the common outlet header 119. Another example mode of control may be to control the pressure of the receiver 117 with the second control valve (CV2) 120, while keeping the first control valve CV1 118 wide open during the TPPL mode. When supplemental cooling is enabled under the VCS mode, the second control valve 120 may receive all the flow of refrigerant, and is therefore enabled to modulate the backpressure on the temperature sensor 132 and/or the pressure sensor 134. Alternatively, the second control valve 120 may be placed in a predetermined fixed position and the first control valve CV1 118 may control the pressure of the respective receiver 117.

Additionally or alternatively, during TPPL operation, a portion of the refrigerant, including at least a portion of the vapor component of the refrigerant, may flow through the upper portion of the TPPL tee 112, out the first outlet 154

(vapor outlet) of the three-way TPPL tee 112, through the TPPL check valve 114, and to the condenser 116. The TPPL check valve 114 may preclude refrigerant from flowing through the TPPL check valve 114 towards the first outlet 154 of the TPPL tee 112, for example, when a pressure at the outlet of the compressor 122 is higher than a pressure upstream of the TPPL check valve 114, between the TPPL check valve 114 and the TPPL tee 112. Thus, when the compressor 122 is energized, gas refrigerant may not flow out of the vapor outlet 154 (first outlet).

The refrigerant may flow through the condenser 116. The condenser 116 may absorb heat from the refrigerant and/or transfer heat from the refrigerant to another area or component, for example, to the ambient environment of the electronics cabinet cooling system 400 or to an area external to the ambient environment. The condenser 116 may, for example, transfer the heat to an external are that is an outdoors environment if the electronics cabinet cooling system 400 is disposed, for example, in a data center building. The refrigerant may flow from the condenser 116, through the first control valve 118, and to the second inlet 144 of the receiver 117.

The first control valve 118, which may also be referred to as a 'subcool control valve', may be adjusted to control the discharge pressure of the compressor 122 and/or to control the cooling capacity of the electronics cabinet cooling system 400 when the compressor 122 is selectively operating to provide additional cooling in a compressor mode where VCS mode is activated. For example, once the compressor 122 is energized, the first control valve 118 may be adjusted to increase or decrease the cooling capacity of the condenser 116 and/or the discharge pressure of the compressor 122 by increasing or decreasing the degree of opening of the first control valve 118. The controller circuitry 130 may control the first control valve 118 based on sensor feedback from the pressure sensor 134 and the temperature sensor 132 disposed downstream of the condenser 116, between the condenser 116 and the receiver 117.

The terms "subcool," "subcooling," and "subcooled," as used herein, unless stated otherwise, alone or in combination with other terms, refer to the phenomenon of a liquid at a temperature below its normal boiling point. For example, as understood by a person of ordinary skill, at standard atmospheric pressure, water boils at 373 K. At room temperature, which may refer to approximately 298 K, the water may be referred to as "subcooled." In another example, r1233zd refrigerants boil at about 18.3 degrees Celsius (65 degrees or 291 K) and about 101 kPascals (1 ATM), such that "subcooled" may refer to temperatures less than about 11-13 degrees Celsius. In yet another example, r123 refrigerants may be used, which boils at 27.8 degrees Celsius at atmospheric pressure.

During operation, when in compressor mode due to a couple of additional degrees of subcool being targeted, the first control valve 118 may be adjusted to maintain the targeted degrees of subcool from VCS mode. Additionally or alternatively, when in compressor mode with the compressor 122 running in VCS mode, another control scheme may be to command the second control valve 120 to a set position and leave the second control valve 120 in the set position. This may provide, for example, a relatively small level of pressure drop so that the first control valve 118 may be adjusted to control distribution of the gas refrigerant flow to the condenser 116 and liquid refrigerant to the receiver 117. By setting the second control valve 120 to a set position, the first control valve 118 and the second control valve 120 are prevented from fighting each other, or in other words, prevented from each trying to correct or continuously re-adjust based on changes in the system 100 due to corrections and adjustments of the other valve due to VCS mode. Additionally or alternatively, in compressor mode, the first control valve 118 may operate as a subcool control valve as described above in VCS mode, and the second control valve 120 may be commanded to a fully open position, thus avoiding fighting of the first control valve 118 and the second control valve 120 (correcting and re-adjusting based on changes due to the other valve as described above) during the addition of VCS mode operation.

During selective VCS operation when the compressor 122 is selectively energized, the refrigerant may flow from the vapor outlet 146 of the receiver 117 to the compressor 122. The compressor 122 may compress and increase the pressure (and temperature) of the refrigerant. The refrigerant may flow from an outlet of the compressor 122 to the recycle line 150, to the bypass line 148, and/or to the compressor check valve 124.

The pressurized refrigerant may flow from the outlet of the compressor 122, to the recycle line 150, through the fourth control valve 128 (also referred to as a superheat control valve), and back upstream of the inlet of the compressor 122, between the inlet of the compressor 122 and the vapor outlet 146 of the receiver 117. The fourth control valve 128 may control the rate of refrigerant flowing through the recycle line 150. For example, when less additional cooling is needed for the condenser 116, the compressor 122 and the VCS loop 138 may be turned down. The fourth control valve 128 may be opened and the recycle line 150 may recirculate the refrigerant from the compressor 122 outlet to the compressor 122 inlet to keep the compressor 122 running without increasing, and/or to provide less supplemental cooling, when the heat load rejection by the condenser 116 is too high.

The terms "superheat," "superheating," and "superheated," as used herein, unless stated otherwise, alone or in combination with other terms, refer to the phenomenon in which fluid is heated to a temperature higher than its boiling point. Additionally or alternatively, "superheat" as used herein, unless stated otherwise, alone or in combination with other terms, refers to the excess of temperature of a vapor above its temperature of saturation and/or the extra heat imparted to a vapor in superheating it from a dry and saturated condition.

The vapor at outlet 146 of the receiver 117 may be saturated vapor. There may be two phases present within the receiver 117. Depending on the design of the receiver 117, operating conditions, and/or other factors, there may be some amount of liquid travelling to the compressor 122 on the conduit between the receiver 117 and the compressor 122, which may cause damage to the compressor 122. By adjusting the amount of recycle flow to the inlet of the compressor 122 from the outlet of the compressor 122, a small degree of 'superheat' may be added to the refrigerant entering the inlet of the compressor 122, which may increase the longevity of the compressor 122. Additionally or alternatively, this may allow a reduction in size or weight of the receiver 117 because lower efficiency separation may be tolerated without adverse consequences to the compressor 122.

Additionally or alternatively, the refrigerant may flow from the compressor 122 to the bypass line 148, through the third control valve 126 (also referred to as a hot gas bypass valve), and to the second inlet 144 of the receiver 117. The refrigerant may flow through the third control valve 126 and mix with refrigerant exiting the condenser 116, before flowing to the receiver 117. The third control valve 126 may control the rate of refrigerant flowing through the bypass line 148. For example, when the electronics cabinet cooling system 400 is operating in a relatively cold environment, for example, Alaska, the condenser 116 may be capable of providing more cooling capacity than in a relatively warm environment, such as Arizona. When the condenser 116 has an increased cooling capacity, but, for example, the cabinet heat exchangers 102 still require a larger amount of cooling than is capable during TPPL operation, the bypass line 148 may provide refrigerant discharged from the compressor 122 back upstream of the receiver 117 to prevent overcooling of the refrigerant in the receiver 117.

Additionally or alternatively, the third control valve 126 may be used when the cooling required by the cabinet heat exchanger 102 is relatively low, but the ambient temperature is high enough that sub-ambient cooling (for example, sub-ambient cooling from the VCS) is needed. In this case, the system 100 may run the compressor 122 to get the sub ambient cooling, but the minimum capacity of the compressor 122 may be too high for the cabinet heat exchangers 102. In such a scenario, the third control valve 126 may be adjusted to control the cooling capacity of the system 100.

Additionally or alternatively, the refrigerant may flow from the compressor 122 to the compressor check valve 124. The compressor check valve 124 may preclude refrigerant from flowing through the compressor check valve 124 towards the compressor 122, for example, when a pressure at the outlet of the compressor 122 is lower than a pressure upstream of the TPPL check valve 114, between the TPPL check valve 114 and the TPPL tee 112.

Refrigerant may flow from the compressor 122, through the compressor check valve 124, and through the condenser 116. The condenser 116 may absorb the heat from the refrigerant and/or transfer the heat from the refrigerant to another area or component, for example, to the ambient environment of the electronics cabinet cooling system 400. The condenser 116 may, for example, transfer the heat to the external environment if the electronics cabinet cooling system 400 is disposed, for example, in a data center. The condenser 116 may absorb heat from the refrigerant. As the condenser 116 absorbs heat, at least a portion of the refrigerant may condense from a vapor to a liquid.

During operation in the compressor mode to include VCS, the refrigerant may flow from the condenser 116, through the first control valve 118, and to the second inlet 144 of the receiver 117. The first control valve 118 may be adjusted to control the discharge pressure of the compressor 122 and/or to control the cooling capacity of the electronics cabinet cooling system 400. For example, the first control valve 118 may be adjusted to increase or decrease the cooling capacity and/or the discharge pressure by increasing or decreasing the degree of opening of the first control valve 118. The controller circuitry 130 may control the first control valve 118 based on sensor feedback from the pressure sensor 134 and the temperature sensor 132 disposed downstream of the condenser 116, between the condenser 116 and the receiver 117. The first control valve 118 may be adjusted to increase pressure and/or increase the saturation temperature of the refrigerant, for example, during VCS operation.

During the optional VCS operation, the refrigerant may flow from the liquid outlet 152 of the receiver 117, through the pump 106, through the filter 108, and/or through the cabinet heat exchangers 102 as describe above during TPPL operation. Additionally or alternatively, when the electronics cabinet cooling system 400 operates with the compressor mode as a vapor cycle system (VCS), the TPPL check valve 114 may close, and all of the refrigerant may flow through the second outlet 140 of the TPPL tee 112 and through the second control valve 120 to the receiver 117. Additionally or alternatively, the second control valve 120 may simultaneously begin to open while the TPPL check valve 114 begins to close so as to not overly backpressure the pump 106 and avoid chattering of the second control valve and the TPPL check valve 114.

The electronics cabinet cooling system 400 may transition from TPPL operation to including VCS operation when an increase in cooling capacity is needed to adequately cool the cabinet heat exchangers 102 and/or when increased heat rejection is required, for example, when the difference between the ambient air temperature and the temperature of the cabinet heat exchanger 102 ($\Delta t$) is relatively low or negative. For example, the condenser 116 may not be able to reject as much heat as is needed to adequately cool the cabinet heat exchangers 102 during TPPL operation when the electronics cabinet cooling system 400 is operating where the temperature of the ambient air is relatively warmer, and/or when the heat to be absorbed from the cabinet heat exchanger 102 is relatively high, for example, when the electronics cabinet cooling system 400 is disposed in a data center experiencing heavy computing usage.

Based on feedback from the pressure sensors 134 and/or the temperature sensors 132, and based on target temperatures of the cabinet heat exchangers 102 and/or the receiver 117, the controller circuitry 130 may determine an increase in cooling capacity is needed, for example, when one or more of the temperature sensors 132 detect a temperature higher than the target temperature at the area of the sensor 132, and in response, the controller circuitry 130 may turn on the compressor 122. As the compressor 122 begins to operate, drawing refrigerant from the receiver 117, compressing the refrigerant, and raising the temperature and pressure of the refrigerant, the pressure at the outlet of the compressor 122 may increase. The pressure at the outlet of the compressor 122 may become larger than a pressure upstream of the TPPL check valve 114. As a result, the compressor check valve 124 may open and the TPPL check valve 114 may close.

Additionally or alternatively, the electronics cabinet cooling system 400 may transition from VCS operation to TPPL operation when the cooling capacity needed to adequately cool the cabinet heat exchanger 102 decreases and/or when decreased heat rejection is required, for example, when the difference between the ambient environment (for example, air) temperature and the temperature of the cabinet heat exchanger 102 ($\Delta t$) is relatively high. For example, the condenser 116 may be able to reject an amount of heat to adequately cool the cabinet heat exchanger 102 during TPPL operation when the electronics cabinet cooling system 400 is operating at a relatively higher altitude where the temperature of the ambient air is relatively low, and/or when the heat energy being absorbed the by cabinet heat exchangers 102 is relatively low, for example, when the electronics cabinet cooling system 400 is disposed in a data center performing business computing, during a weekend or other time when the server computers are relatively inactive.

Figure 5:
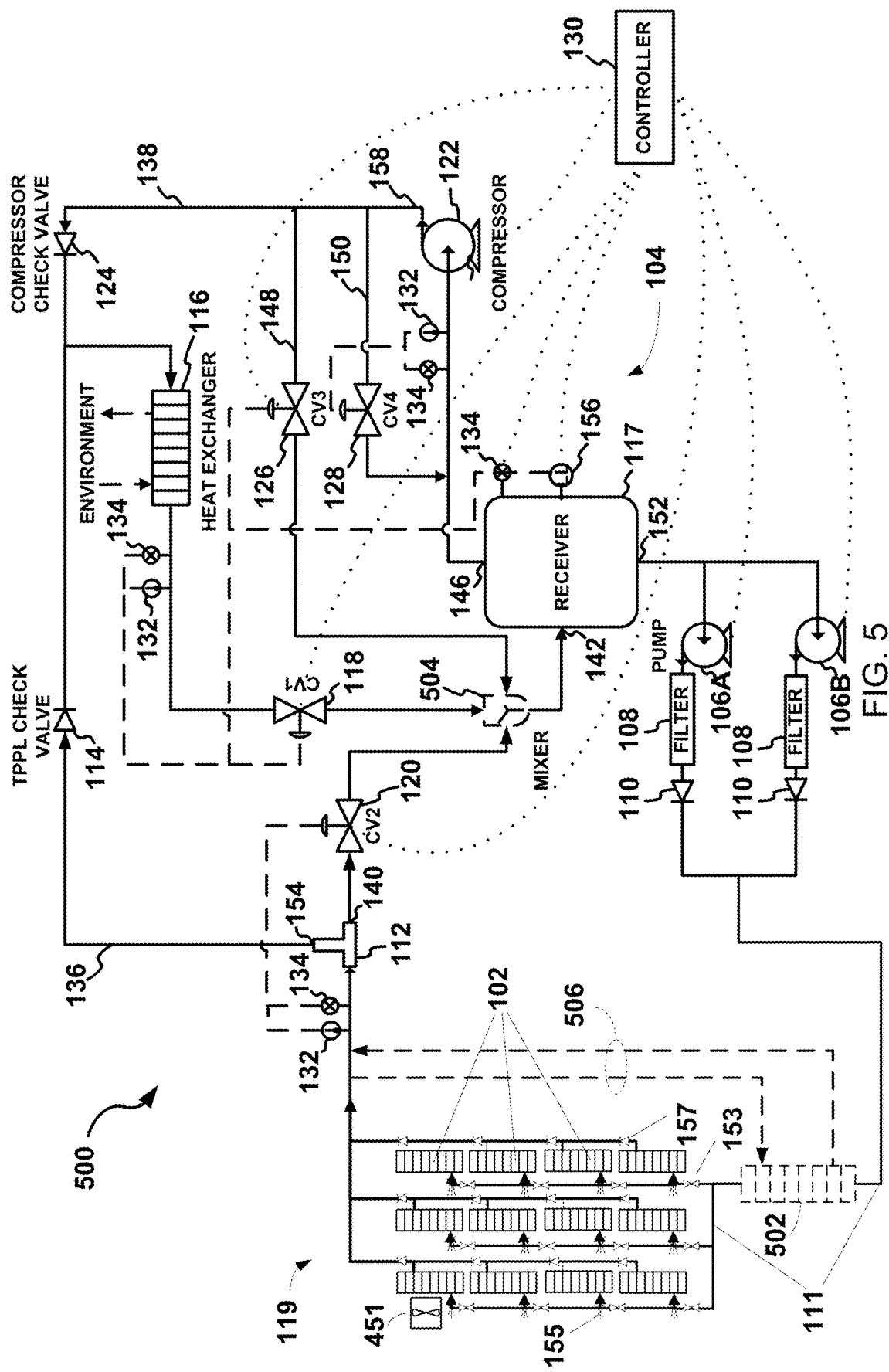
FIG. 5 is a schematic of another example electronic cabinet cooling system in an environment having multiple electronic cabinets.

FIG. 5 is a schematic of an example electronic cabinet cooling system 500 in an environment having multiple electronic cabinets. All features and functionality discussed with reference to FIGS. 1-4 are applicable to the following embodiments and examples unless otherwise indicated. The electronic cabinet cooling system 500 may include all of the components of electronics cabinet cooling system 400. The electronic cabinet cooling system 500 may include one or more pumps 106, one or more filters 108, one or more pump check valves, a preheater 502, and/or a mixer 504.

In the example of FIG. 5, two pumps 106A and 106B are disposed downstream of the receiver 117. In other examples, additional pumps 106 may be used. The liquid outlet 152 of the receiver 117, such as a liquid vapor separator, may provide refrigerant from the receiver 117 to the multiple pumps 106. The pumps 106 may be in parallel with each other. Each pump 106 may have a filter 108 and/or a pump check valve 110 disposed downstream of the pump 106. During operation, refrigerant may flow from the receiver 117 and split between different cooling lines downstream of the receiver 117, wherein each one of the cooling lines includes one of the pumps 106, one of the filters 108, and one of the pump check valves 110. The parallel cooling lines may then merge back together into a single common inlet header line 111 downstream of the pump check valves 110, between the pump check valves 110 and the preheater 502 and/or the cabinet heat exchangers 102.

The preheater 202 may be disposed downstream of the pump check valves 110, filters 108, and/or pumps 106 and upstream of the cabinet heat exchanger 102. Refrigerant may flow from the pumps 106 to through the preheater 502 and then in parallel to the cabinet heat exchangers 102. The preheater 502 may be any device capable of transferring heat to the refrigerant upstream of the cabinet heat exchangers 102, for example, the preheater 502 may be a recuperator and/or a tube in tube heat exchanger. A circulation refrigerant line 506 may extend from the common outlet header 119 downstream of the cabinet heat exchangers 102, between the cabinet heat exchangers 102 and the three-way TPPL tee 112, to the preheater 502, through the preheater 502, and back to the common outlet header 119 downstream of the cabinet heat exchangers 102.

During operation, refrigerant may flow from the pumps 106, though the preheater 502, and to the cabinet heat exchanger 102. The preheater 502 may pass refrigerant flowing from the pumps 106A and 106B in close proximity to the flow of refrigerant from downstream of the cabinet heat exchangers 102 to transfer heat to the flow of refrigerant flowing from the pumps 106. Preheating the refrigerant flowing from the pumps 106 before flowing to the cabinet heat exchangers 102 may increase the efficiency of the electronics cabinet cooling system 400.

The mixer 504 may be disposed downstream of the first control valve 118, the second control valve 120, and/or the third control valve 126. The mixer 504 may be disposed upstream of the first inlet 142 of the receiver 117. The mixer 504 may be any device capable of receiving a flow of refrigerant from the first control valve 118, the second control valve 120, and/or the third control valve 126, and mixing the separate flows from each respective control valve 118, 120, 126 into a single refrigerant flow. During operation, refrigerant may flow to the mixer 504 from the common outlet header 119 through the second control valve 120, to the mixer 504 from the condenser 116 through the first control valve 118, and/or to the mixer 504 from the compressor 122 through the third control valve 126. The refrigerant may be mixed in the mixer 504 and flow through an outlet of the mixer 504 to the first inlet 142 of the receiver 117.

The mixer 504 may enable improved average pressure and/or temperature sensing to be used for control, improve controllability of the compressor 122 during turndown conditions, and/or reduce the size and/or weight of the receiver 117 by limiting the number of higher stress ports on a larger diameter vessel. The mixer 504 may improve the compressor 122 control during turndown by avoiding a thermal runaway condition. A thermal runaway condition may occur during compressor mode in VCS when the hot gas from the third control valve 126 travels in a loop through the receiver 117 and back to the compressor 122 without being adequately cooled via latent heat absorption from vaporizing some of the liquid phase of the refrigerant.

Figure 6:
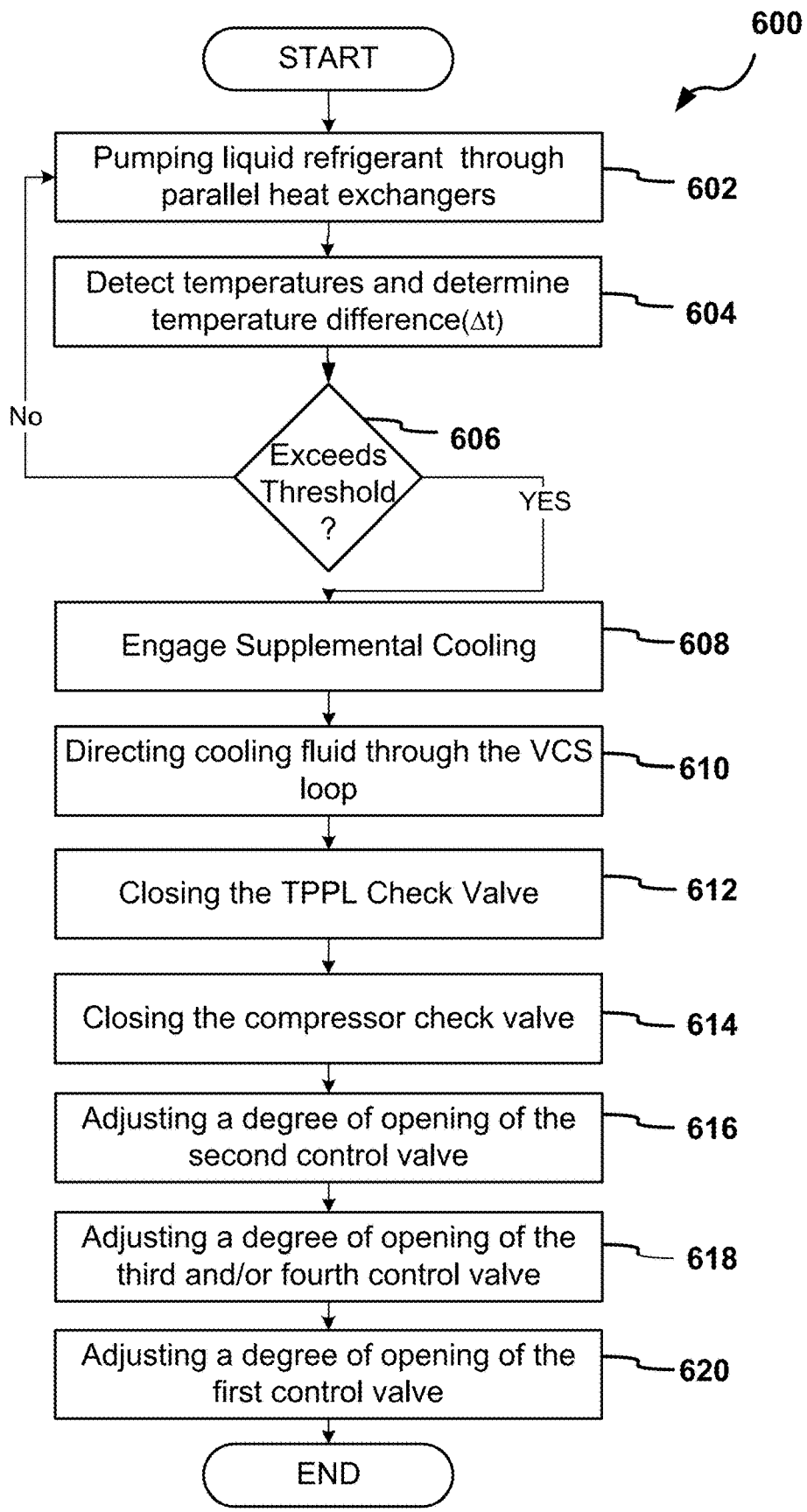
FIG. 6 illustrates a logic flow diagram of example operation of the electronics cabinet cooling system.

FIG. 6 illustrates a logic flow diagram of example operation (600) of the electronics cabinet cooling system. Referring to FIGS. 1-6, during operation of the electronics cabinet cooling system in TPPL mode, liquid refrigerant may be pumped by the pump(s) 106 in parallel through cabinet heat exchangers 102 (602) to absorb heat from a flow of hot air provided from electronic components in an electronic cabinet while changing at least some of the liquid refrigerant to gas refrigerant in order to reject the heat to an ambient temperature environment. During operation in the TPPL mode, the TPPL check valve 114 is open and the compressor check valve 124 is closed. The TPPL 136 may include the receiver 117, the cabinet heat exchangers 102 downstream from the receiver 117, the three-way TPPL tee 112 downstream from the cabinet heat exchanger 102, the TPPL check valve 114 downstream from the three-way TPPL tee 112, and the condenser 116 downstream from the TPPL check valve 114 and upstream from the receiver 117.

The controller circuitry 130 in the electronics cabinet cooling system may detect the ambient temperature around the condenser 116 with a temperature sensor and determine a temperature differential ($\Delta t$) of the refrigerant temperature downstream of the cabinet heat exchangers 102 and the ambient temperature. (604) The controller circuitry 130 determines if the ambient temperature has exceeded a predetermined threshold. (606) The predetermined threshold may be where the transfer of the heat from the heated flow of air from electronic components drops below a predetermined threshold level of efficiency such as where the liquid refrigerant is unable to adequately absorb heat from the heated flow of air and additional cooling of the refrigerant at the condenser is warranted. The controller circuitry 130 may engage supplemental cooling. (608) Supplemental cooling may be provided by external systems, such as an air conditioning system, a thermal storage system, and/or the vapor cycle system (VCS) mode. In the example operation of FIG. 6, engagement of the VCS mode is illustrated, by entering a compressor mode where the compressor 22 may be energized to provide additional supplemental cooling using VCS. In other examples, other systems may provide the supplemental cooling as discussed herein.

Energizing the compressor directs the refrigerant (304) through a vapor cycle system (VCS) loop 138 due to the compressor check valve 124 being opened by the pressure from the compressor 22, and the TPPL check valve 114 being closed. (610) The vapor cycle system loop 138 may include the receiver 117, the compressor 122 downstream from the receiver 117, the compressor check valve 124 downstream from the compressor 122 and upstream of the condenser 116, and the condenser 116. The TPPL check valve 114 may be closed (612) if a discharge pressure of the compressor 122 is higher than a pressure of the two-phase pumped loop 136 upstream of the TPPL check valve 114. The compressor check valve 124 may be closed (614) if a pressure at an inlet of the condenser 116 is higher than a pressure at an outlet of the compressor 122.

A degree of opening of the second control valve 120 disposed downstream from the TPPL tee 112 may be adjusted (616) based on feedback from the pressure sensor 134 and/or the temperature sensor 132. The pressure sensor 134 and/or the temperature sensor 132 may be disposed upstream of the TPPL tee 112. Additionally or alternatively, a degree of opening of the second control valve 120 may be adjusted (616) based on the pressure and/or temperature of the receiver 117, which may be measured by using the instrumentation upstream of the compressor 122 when the compressor 122 is off.

A degree of opening of the third control valve 126 and/or the fourth control valve 128 disposed downstream from the compressor may be adjusted (618) based on feedback from the pressure sensor 134 and/or the temperature sensor 132. The pressure sensor 134 and/or the temperature sensor 132 may be disposed upstream of the compressor.

A degree of opening of the first control valve 118 disposed downstream from the heat exchanger may be adjusted (620) based on feedback from the pressure sensor 134 and/or the temperature sensor 132. The pressure sensor 134 and/or the temperature sensor 132 may be disposed downstream of the condenser 116.

The logic illustrated in the flow diagrams may include additional, different, or fewer operations than illustrated. The operations illustrated may be performed in an order different than illustrated.

The steps may include additional, different, or fewer steps than illustrated in FIG. 6. The steps may be executed in a different order than illustrated in FIG. 6. For example the step of closing (614) the compressor check valve 124 may come before the step of directing (602) refrigerant through the TPPL 136. Alternatively or additionally, the step of closing (612) the TPPL check valve 114 may come before the step of directing (610) refrigerant through the VCS loop 138. Alternatively or additionally, the step of adjusting (616, 618, 620) the first control valve 118, the second control valve 120, the third control valve 126, and/or the fourth control valve 128 may occur before or after any one of the other steps. Alternatively or additionally, any one of the steps illustrated in FIG. 6 may occur multiple times and/or in any order.

Although the flow chart in FIG. 6 may appear to imply that the steps illustrated are performed in series, any of the steps illustrated in FIG. 6 may be performed simultaneously. For example, of pumping (602) liquid refrigerant through the TPPL 136 may occur while closing (614) the compressor check valve 124 or while adjusting (616, 618, 620) the first control valve 118, the second control valve 120, the third control valve 126, and/or the fourth control valve 128.

Each component may include additional, different, or fewer components. For example the cabinet heat exchanger 102 may include an evaporator, a cold plate, a rectifier flow control valve, and/or a subscale cold plate. Additionally or alternatively, the compressor 122 may include multiple compressors, a filter, a drier, and/or a boost pump.

The electronics cabinet cooling system may be implemented with additional, different, or fewer components. For example, the electronics cabinet cooling system may include multiple heat loads in addition to the cabinet heat exchangers 102, multiple check valves 110, 114, 124, multiple heat exchangers 116, multiple pumps 106, multiple control valves 120, 118, 126, 128, and multiple pressure sensors 134 and/or temperature sensors 132. The electronics cabinet cooling system may include other types of sensors, for example, mass flow rate sensors and/or liquid level sensors. The electronics cabinet cooling system may include a subcooler upstream of the pump 106, between the pump 106 and the receiver 117, to add cooling and/or avoid cavitation at the pump 106.

Additionally, or alternatively, the controller circuitry 130 may include a memory circuitry (not shown), a processor circuitry (not shown), and a network interface circuitry (not shown). The processor circuitry may be in communication with the memory circuitry and a network interface. The memory circuitry may be non-transitory. The processor circuitry and other components of the electronics cabinet cooling system may be in communication with each other. For example, the first control valve 118, the second control valve 120, the third control valve 126, the fourth control valve 128, the receiver 117, the pressure sensors 134, and/or temperature sensors 132 may be in communication with the processor circuitry. Additionally or alternative, the processor circuitry may be in communication with one or more sensors. The sensors may be, for example, pressure sensors, flow sensors, and/or temperature sensors. There may be, for example, optical and/or electrical connections between the controller circuitry 130 and each one of the components of the electronics cabinet cooling system 400, 200 by which the processor circuitry and one or more of the components communicate.

In one example, the processor circuitry may also be in communication with additional elements, such as a display. Examples of the processor circuitry may include a general processor, a central processing unit, a microcontroller, a server, an application specific integrated circuit (ASIC), a digital signal processor, a field programmable gate array (FPGA), a controller, a PLC, and/or a digital circuit, analog circuit.

The processor may be one or more devices operable to execute logic. The logic may include computer executable instructions or computer code embodied in the memory circuitry or in other memory circuitry that when executed by the processor circuitry, cause the processor circuitry to perform the features implemented by the logic. The computer code may include instructions executable with the processor.

To clarify the use of and to hereby provide notice to the public, the phrases "at least one of <A>, <B>, . . . and <N>" or "at least one of <A>, <B>, . . . or <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

A first aspect relates to a cooling system comprising: a two-phase pumped loop (TPPL), the two-phase pumped loop including a receiver, a pump downstream from the receiver, a heat load downstream from the pump, a TPPL check valve downstream from the heat load, and a heat exchanger downstream from the TPPL check valve and upstream from the receiver; and a vapor cycle system (VCS) loop, the vapor cycle system loop including the receiver, a compressor downstream from a vapor outlet of the receiver, a compressor check valve downstream from the compressor and upstream of the heat exchanger, and the heat exchanger, wherein the heat load, which is in the TPPL, is in the VCS loop downstream from a liquid outlet of the receiver, wherein the two-phase pumped loop is configured to operate in a TPPL mode in which a refrigerant flows through the two-phase pumped loop due to the TPPL check valve being open and the compressor check valve being closed, and wherein the vapor cycle system loop is configured to operate in a VCS mode in which the refrigerant flows through the vapor cycle system loop due to the TPPL check valve being closed and the compressor check valve being open.

A second aspect relates to the cooling system of aspect 1, wherein the TPPL further includes a TPPL tee downstream from the heat load, wherein the TPPL check valve is downstream of the TPPL tee.

A third aspect relates to the cooling system of any preceding aspect, wherein the compressor check valve is configured to close if a pressure at an inlet of the heat exchanger is higher than a pressure at an outlet of the compressor and/or wherein the TPPL check valve is configured to close if a pressure at an outlet of the compressor is higher than a pressure of the two-phase pumped loop upstream of the TPPL check valve.

A fourth aspect relates to the cooling system of any preceding aspect, further comprising a cooling line extending from an outlet of the TPPL tee to the receiver, wherein the cooling line comprises a control valve downstream the TPPL tee and upstream of the receiver.

A fifth aspect relates to the cooling system of any preceding aspect, further comprising a pressure sensor and/or a temperature sensor disposed upstream of the TPPL tee, and a controller, wherein the controller is configured to adjust a degree of opening of the control valve based on feedback from the pressure sensor and/or the temperature sensor, wherein a temperature of the heat load is affected by the degree of opening of the control valve.

A sixth aspect relates to the cooling system of any preceding aspect, further comprising a recycle line extending from an outlet of the compressor back upstream to an inlet of the compressor, wherein the recycle line comprises a control valve downstream from the compressor, wherein the recycle line is configured to recirculate the refrigerant from the outlet of the compressor to the inlet of the compressor to heat the refrigerant at the inlet of the compressor.

A seventh aspect relates to the cooling system of any preceding aspect, further comprising a pressure sensor and/or a temperature sensor disposed upstream of the compressor, and a controller, wherein the controller is configured to adjust a degree of opening of the control valve based on feedback from the pressure sensor and/or the temperature sensor.

An eighth aspect relates to the cooling system of any preceding aspect, further comprising a bypass line extending from an outlet of the compressor to an inlet of the receiver, wherein the bypass line comprises a control valve disposed downstream from the compressor.

A ninth aspect relates to the cooling system of any preceding aspect, further comprising a pressure sensor and/or a temperature sensor upstream of the compressor, and a controller, wherein the controller is configured to adjust a degree of opening of the control valve based on feedback from the pressure sensor and/or the temperature sensor, wherein the bypass line is configured to recirculate the refrigerant from the outlet of the compressor to the receiver to heat the refrigerant in the receiver.

A tenth aspect relates to the cooling system of any preceding aspect, further comprising a control valve downstream the heat exchanger and upstream of the receiver, a pressure sensor and/or a temperature sensor downstream from the heat exchanger, and a controller, wherein the controller is configured to adjust a degree of opening of the control valve based on feedback from the pressure sensor and/or the temperature sensor.

An eleventh aspect relates to the cooling system of any preceding aspect, further comprising a mixer disposed upstream of the receiver and downstream from the heat load, the compressor, and the heat exchanger.

A twelfth aspect relates to the cooling system of any preceding aspect, wherein the TPPL tee is a T-shaped separator.

A thirteenth aspect relates to the cooling system of any preceding aspect, further comprising a preheater upstream of the heat load and downstream from the pump, wherein the preheater is configured to preheat the refrigerant entering the heat load by transferring heat from the refrigerant exiting the heat load.

A fourteenth aspect relates to a method of cooling a heat load, the method comprising: directing a refrigerant through a two-phase pumped loop (TPPL) in a TPPL mode due to a TPPL check valve being open and a compressor check valve being closed, the two-phase pumped loop including a receiver, a heat load downstream from the receiver, the TPPL check valve downstream from the heat load, and a heat exchanger downstream from the TPPL check valve and upstream from the receiver; directing the refrigerant through a vapor cycle system (VCS) loop in VCS mode due to the TPPL check valve being closed and the compressor check valve being open, the vapor cycle system loop including the receiver, a compressor downstream from a vapor outlet of the receiver, the compressor check valve downstream from the compressor and upstream of the heat exchanger, and the heat exchanger, wherein the heat load, which is in the TPPL, is in the VCS loop downstream from a liquid outlet of the receiver.

A fifteenth aspect relates to the method of aspect 14, further comprising closing the TPPL check valve if a discharge pressure of the compressor is higher than a pressure of the two-phase pumped loop upstream of the TPPL check valve when the cooling capacity of the TPPL is insufficient to cool the heat load.

A sixteenth method relates to the method of any preceding aspect, further comprising closing the compressor check valve if a pressure at an inlet of the heat exchanger is higher than a pressure at an outlet of the compressor when the cooling capacity of the TPPL is sufficient to cool the heat load.

A seventeenth aspect relates to the method of any preceding aspect, wherein the TPPL further includes a TPPL tee downstream from the heat load, wherein the TPPL check valve is downstream of the TPPL tee, the method further comprising adjusting a degree of opening of a control valve disposed downstream from the TPPL tee based on feedback from a pressure sensor and/or a temperature sensor, wherein the pressure sensor and/or the temperature sensor is disposed upstream of the TPPL tee.

An eighteenth aspect relates to the method of any preceding aspect, further comprising adjusting a degree of opening of a control valve disposed downstream from the compressor based on feedback from a pressure sensor and/or a temperature sensor, wherein the pressure sensor and/or the temperature sensor is disposed upstream of the compressor.

A nineteenth aspect relates to the method of any preceding aspect, further comprising adjusting a degree of opening of a control valve disposed downstream from the heat exchanger based on feedback from a pressure sensor and/or a temperature sensor, wherein the pressure sensor and/or the temperature sensor is disposed downstream of the heat exchanger.

A twentieth aspect relates to a cooling system comprising: a two-phase pumped loop (TPPL), the two-phase pumped loop including a receiver, a pump downstream from the receiver, a heat load downstream from the pump, a TPPL tee downstream from the heat load, a TPPL check valve downstream from the TPPL tee, and a heat exchanger downstream from the TPPL check valve and upstream from the receiver; and a vapor cycle system (VCS) loop, the vapor cycle system loop including the receiver, a compressor downstream from a vapor outlet of the receiver, a compressor check valve downstream from the compressor and upstream of the heat exchanger, and the heat exchanger, wherein the heat load, which is in the TPPL, is in the VCS loop downstream from a liquid outlet of the receiver, wherein the two-phase pumped loop is configured to operate in a TPPL mode in which a refrigerant flows through the two-phase pumped loop due to the TPPL check valve being open and the compressor check valve being closed, and wherein the vapor cycle system loop is configured to operate in a VCS mode in which the refrigerant flows through the vapor cycle system loop due to the TPPL check valve being closed and the compressor check valve being open, wherein the TPPL check valve is configured to close if, in response to the compressor being turned on, a pressure at an outlet of the compressor is higher than a pressure of the two-phase pumped loop upstream of the TPPL check valve, wherein the compressor check valve is configured to close if, in response to the compressor being turned off, a pressure at an inlet of the heat exchanger is higher than a pressure at an outlet of the compressor.

In addition to the features mentioned in each of the independent aspects enumerated above, some examples may show, alone or in combination, the optional features mentioned in the dependent aspects and/or as disclosed in the description above and shown in the figures.

What is claimed is:

1. An electronics cabinet cooling system comprising:
   a plurality of respective server electronic cabinets having server electronic components therein;
   a plurality of heat exchangers, each of the heat exchangers disposed on a respective server electronic cabinet in position to receive a flow of hot air moving from the server electronic components to the heat exchangers;
   a pump configured to pump a refrigerant as liquid refrigerant through the heat exchangers such that at least some of the refrigerant is changed from the liquid refrigerant to a gas refrigerant during transfer of heat, by the heat exchanger, from the flow of hot air to the refrigerant;
   a common outlet header comprising a three-way tee, a combination of the liquid refrigerant and the gas refrigerant received from the plurality of heat exchangers into the common outlet header and directed to an entry to the three-way tee, the liquid refrigerant separated, at least partially, from the gas refrigerant such that the liquid refrigerant exits the three-way tee through a liquid exit, and the gas refrigerant exits the three-way tee through a vapor exit;
   a condenser arranged to change the gas refrigerant received from the vapor exit to the liquid refrigerant; and
   a receiver in receipt of the liquid refrigerant from the liquid exit of the three-way tee, and in receipt of the liquid refrigerant from the condenser, the receiver supplying liquid refrigerant to the pump.

2. The electronics cabinet cooling system of claim 1, wherein each of the heat exchangers is constructed of a plastic polymer having a wall thickness to carry the liquid refrigerant received in the heat exchangers in a pressure range of between $2.0265 \times 10^4$ PA and $70.9275 \times 10^4$ PA.

3. The electronics cabinet cooling system of claim 2, wherein the wall thickness is between 0.0178 millimeters and 0.381 millimeters.

4. The electronics cabinet cooling system of claim 1, wherein the refrigerant changes phase from the liquid refrigerant to the gas refrigerant in the heat exchangers in a range of 10 to 60 degrees Celsius at atmospheric pressure.

5. The electronics cabinet cooling system of claim 1, wherein the pump comprises a first pump and a second pump, and each of the heat exchangers includes a first tube bundle and a second tube bundle, the first tube bundle in liquid communication with the first pump and the second tube bundle in liquid communication with the second pump to create independent flow paths for the refrigerant in each of the heat exchangers.

6. The electronics cabinet cooling system of claim 5, wherein the first tube bundle and the second tube bundle of each of the plurality of heat exchangers receive the liquid refrigerant in parallel.

7. The electronics cabinet cooling system of claim 1, wherein each of the heat exchangers is constructed by at least one of injection molding, rotational molding, extrusion molding of a plastic polymer, 3D printing, or milling/turning material removal.

8. The electronics cabinet cooling system of claim 1, wherein each of the heat exchangers includes an orifice restriction upstream of an inlet to a respective heat exchanger to manage equilibrium of flow of the refrigerant to respective heat exchangers, a predetermined size of the orifice restriction being different for at least two respective heat exchangers.

9. The electronics cabinet cooling system of claim 1, further comprising a fan configured to move the flow of hot air away from the server electronic components and through heat exchanger.

10. A method of cooling an electronics cabinet comprising:
    heating a flow of air with electronic components in each of a plurality of electronic cabinets to create a heated flow of air;
    directing the heated flow of air to a heat exchanger mounted at an air discharge of each of the respective electronics cabinets;
    pumping, with a pump, a refrigerant as a liquid refrigerant into the heat exchanger of each respective electronic cabinet;
    absorbing heat from the heated flow of air into the liquid refrigerant, causing at least a portion of the liquid refrigerant to change to a gas refrigerant;
    routing the liquid refrigerant and the gas refrigerant from each of the respective electronic cabinets to a common outlet header;
    receiving the liquid refrigerant and the gas refrigerant at an entry to a three-way tee in liquid communication with the common outlet header;

separating the gas refrigerant received from the common outlet header to flow through a vapor exit from the three-way tee;

separating the liquid refrigerant received from the common outlet header to flow through a liquid exit from the three-way tee;

channeling the gas refrigerant to a condenser;

converting, with the condenser, the gas refrigerant to liquid refrigerant;

channeling the liquid refrigerant from the condenser to a reservoir;

channeling the liquid refrigerant from the liquid exit of the three-way tee to the reservoir;

combining in the reservoir the liquid refrigerant from the condenser and the liquid refrigerant from the liquid exit of the three-way tee; and supplying the liquid refrigerant in the reservoir to the pump.

11. The method of claim 10, wherein the heat exchanger of each respective electronic cabinet includes at least one tube bundle constructed from plastic polymer, and absorbing heat from the heated flow of air into the liquid refrigerant comprises absorbing heat through a respective wall of a plurality of tubes in the tube bundle and changing at least part of the liquid refrigerant to the gas refrigerant at substantially atmospheric pressure in response to the heat being absorbed.

12. The method of claim 10, wherein absorbing heat from the heated flow of air into the liquid refrigerant, causing at least a portion of the liquid refrigerant to change to the gas refrigerant further comprises changing phase of the liquid refrigerant to the gas refrigerant in the heat exchanger in a range of 10-60 degrees Celsius at atmospheric pressure.

13. The method of claim 12, wherein absorbing heat from the heated flow of air into the liquid refrigerant comprises transferring the heat through a wall of each of a plurality of tubes included in the heat exchanger and carrying the refrigerant, each of the tubes being constructed from a thermoplastic material or a thermoset material.

14. The method of claim 10, wherein pumping, with the pump, the refrigerant as the liquid refrigerant into the heat exchanger of each of the respective electronic cabinets comprises independently supplying the liquid refrigerant in parallel, via separate pumps, to a first tube bundle and a second tube bundle included in the heat exchanger of each of the respective electronic cabinets.

15. The method of claim 10, further comprising sensing, with a temperature sensor, an ambient temperature above a predetermined threshold; energizing a compressor; automatically diverting the gas refrigerant to the compressor with a check valve; compressing the gas refrigerant to create pressurized gas refrigerant; channeling the pressurized gas refrigerant to the condenser; converting, with the condenser, the pressurized gas refrigerant to liquid refrigerant; and channeling the liquid refrigerant from the condenser to the reservoir.

16. The method of claim 10, further comprising detecting an ambient temperature surrounding the condenser, determining, with controller circuitry, a temperature difference between the ambient temperature and a temperature of the refrigerant received from the heat exchanger of each respective electronic cabinet, and energizing, with the controller circuitry a compressor during a compressor mode to provide additional cooling of the refrigerant in the condenser.

17. An electronics cabinet cooling system comprising:

a plurality of cabinet heat exchangers mounted at an air discharge of respective electronics cabinets, the cabinet heat exchangers positioned at the respective air discharge to transfer heat to a refrigerant flowing in parallel through the cabinet heat exchangers, the heat transferred to the refrigerant from a flow of hot air provided in the heat exchangers from electronic components operable in the respective electronics cabinets;

a three-way tee having an inlet operable to receive the refrigerant in parallel from the heat exchangers, the refrigerant being at least partially gas and at least partially liquid, the three-way tee having a first outlet to direct gas refrigerant out of the three-way tee, and a second outlet to direct liquid refrigerant out of the three-way tee;

a receiver configured to receive the liquid refrigerant directed out of the three-way tee;

a condenser configured to receive the gas refrigerant directed out of the three-way tee and reject heat from the gas refrigerant into air at an ambient air temperature to change the gas refrigerant to liquid refrigerant for output by the condenser to the receiver; and a pump in liquid communication with the liquid refrigerant in the receiver, the pump operable to pump the liquid refrigerant in parallel through the heat exchangers.

18. The electronics cabinet cooling system of claim 17, further comprising an orifice at an inlet of each of the heat exchangers to equalize parallel flow distribution of the refrigerant to the each of the heat exchangers, the orifice sized according a heat load of a respective electronics cabinet.

19. The electronics cabinet cooling system of claim 17, wherein each of the cabinet heat exchangers comprises a first tube bundle operable in parallel with a second tube bundle, both the first tube bundle and the second tube operable at 50% or less total heat absorption capacity to create redundancy within each of the cabinet heat exchangers.

* * * * *